US006623908B2

(12) United States Patent
Zheng et al.

(10) Patent No.: US 6,623,908 B2
(45) Date of Patent: Sep. 23, 2003

(54) THERMAL IMAGING COMPOSITION AND IMAGING MEMBER CONTAINING POLYMETHINE IR DYE AND METHODS OF IMAGING AND PRINTING

(75) Inventors: Shiying Zheng, Rochester, NY (US); Ruizheng Wang, Rochester, NY (US); Kevin W. Williams, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 183 days.

(21) Appl. No.: 09/819,974

(22) Filed: Mar. 28, 2001

(65) Prior Publication Data

US 2002/0197563 A1 Dec. 26, 2002

(51) Int. Cl.[7] ........................................ G03F 7/038

(52) U.S. Cl. ........................ 430/270.1; 430/281.1; 430/286.1; 430/287.1; 430/288.1; 430/302; 430/348; 430/944; 430/945; 430/964

(58) Field of Search .................. 430/270.1, 271.1, 430/272.1, 281.1, 285.1, 286.1, 287.1, 288.1, 302, 348, 434, 944, 945, 964

(56) References Cited

U.S. PATENT DOCUMENTS 4,547,444 A 10/1985 Bell et al. .............. 430/11
4,548,893 A * 10/1985 Lee et al. .............. 430/296
4,693,958 A * 9/1987 Schwartz et al. .......... 430/302
4,950,639 A 8/1990 DeBoer et al. ............ 503/227
5,135,842 A 8/1992 Kitchin et al. ........... 430/510
5,512,418 A * 4/1996 Ma ...................... 430/271.1
5,814,431 A * 9/1998 Nagasaka et al. ......... 430/281.1
5,856,061 A * 1/1999 Patel et al. ............ 430/201
5,985,514 A 11/1999 Zheng et al. ............ 430/270.1
6,074,802 A * 6/2000 Murata et al. ........... 430/270.1
6,096,471 A * 8/2000 Van Damme et al. ....... 430/188
6,159,657 A * 12/2000 Fleming et al. ......... 430/270.1
6,162,578 A * 12/2000 Zheng et al. ........... 430/270.1
6,165,679 A * 12/2000 Van Damme et al. ... 430/270.1
6,165,691 A * 12/2000 Damme et al. ........... 430/303
6,190,830 B1 2/2001 Leon et al. .............. 430/270.1
6,190,831 B1 2/2001 Leon et al. .............. 430/270.1
6,242,155 B1 * 6/2001 Yamasaki et al. ........ 430/270.1
6,399,268 B1 * 6/2002 Fleming et al. .......... 430/270.1
6,410,202 B1 * 6/2002 Fleming et al. .......... 430/270.1
6,413,694 B1 * 7/2002 Zheng et al. ............ 430/270.1
6,423,469 B1 * 7/2002 DoMinh et al. .......... 430/270.1
6,447,978 B1 * 9/2002 Leon et al. ............. 430/270.1
6,451,500 B1 * 9/2002 Leon .................... 430/270.1
6,465,152 B1 * 10/2002 DoMinh et al. ......... 430/271.1
2002/0114966 A1 * 8/2002 Urano .................. 428/522

FOREIGN PATENT DOCUMENTS

EP 321 923 A2 * 6/1989 ........... B41M/5/26
EP 0 652 483 A1 5/1995
EP 784 233 A1 * 7/1997 ........... G03F/7/004
EP 0 990 517 A2 4/2000

* cited by examiner

*Primary Examiner*—Janet Baxter
*Assistant Examiner*—Barbara Gilliam
(74) *Attorney, Agent, or Firm*—J. Lanny Tucker

(57) ABSTRACT

An imaging member, such as a negative-working printing plate or on-press cylinder, has an imaging layer comprised of a thermally sensitive ionomer (charged polymer) and a photothermal conversion material that is a bis(aminoaryl) polymethine dye that is soluble in water or a water-miscible organic solvent, and that has a $\lambda_{max}$ greater than 700 nm as measured in water or the water-miscible organic solvent.

36 Claims, No Drawings

THERMAL IMAGING COMPOSITION AND IMAGING MEMBER CONTAINING POLYMETHINE IR DYE AND METHODS OF IMAGING AND PRINTING

FIELD OF THE INVENTION

This invention relates in general to thermal imaging compositions and to lithographic imaging members (particularly lithographic printing plates) prepared therefrom. The invention also relates to a method of imaging such imaging members, and to a method of printing using them.

BACKGROUND OF THE INVENTION

The art of lithographic printing is based upon the immiscibility of oil and water, wherein an oily material or ink is preferentially retained by an imaged area and the water or fountain solution is preferentially retained by the non-imaged areas. When a suitably prepared surface is moistened with water and ink is then applied, the background or non-imaged areas retain the water and repel the ink while the imaged areas accept the ink and repel the water. The ink is then transferred to the surface of a suitable substrate, such as cloth, paper or metal, thereby reproducing the image.

Very common lithographic printing plates include a metal or polymer support having thereon an imaging layer sensitive to visible or UV light. Both positive- and negative-working printing plates can be prepared in this fashion. Upon exposure, and perhaps post-exposure heating, either imaged or non-imaged areas are removed using wet processing chemistries.

Thermally sensitive printing plates are becoming more common. Examples of such plates are described in U.S. Pat. No. 5,372,915 (Haley et al.). They include an imaging layer comprising a mixture of dissolvable polymers and an infrared radiation-absorbing compound. While these plates can be imaged using lasers and digital information, they require wet processing using alkaline developer solutions.

It has been recognized that a lithographic printing plate could be created by ablating an IR absorbing layer. For example, Canadian Patent 1,050,805 (Eames) discloses a dry planographic printing plate comprising an ink receptive substrate, an overlying silicone rubber layer, and an interposed layer comprised of laser energy absorbing particles (such as carbon particles) in a self-oxidizing binder (such as nitrocellulose). Such plates were exposed to focused near IR radiation with a $Nd^{++}$YAG laser. The absorbing layer converted the infrared energy to heat thus partially loosening, vaporizing or ablating the absorber layer and the overlying silicone rubber. Similar plates are described in *Research Disclosure* 19201, 1980 as having vacuum-evaporated metal layers to absorb laser radiation in order to facilitate the removal of a silicone rubber overcoated layer. These plates were developed by wetting with hexane and rubbing. Other publications describing ablatable printing plates include U.S. Pat. No. 5,385,092 (Lewis et al.), U.S. Pat. No. 5,339,737 (Lewis et al.), U.S. Pat. No. 5,353,705 (Lewis et al.), U.S. Reissued Pat. No. 35,512 (Nowak et al.), and U.S. Pat. No. 5,378,580 (Leenders).

While the noted printing plates used for digital, processless printing have a number of advantages over the more conventional photosensitive printing plates, there are a number of disadvantages with their use. The process of ablation creates debris and vaporized materials that must be collected. The laser power required for ablation can be considerably high, and the components of such printing plates may be expensive, difficult to coat, or unacceptable for resulting printing quality. Such plates generally require at least two coated layers on a support.

Thermally switchable polymers have been described for use as imaging materials in printing plates. By “switchable” is meant that the polymer is rendered from hydrophobic to relatively more hydrophilic or, conversely from hydrophilic to relatively more hydrophobic, upon exposure to heat.

U.S. Pat. No. 4,034,183 (Uhlig) describes the use of high-powered lasers to convert hydrophilic surface layers to hydrophobic surfaces. A similar process is described for converting polyamic acids into polyimides in U.S. Pat. No. 4,081,572 (Pacansky). The use of high-powered lasers is undesirable in the industry because of their high electrical power requirements and because of their need for cooling and frequent maintenance.

U.S. Pat. No. 4,634,659 (Esumi et al.) describes imagewise irradiating hydrophobic polymer coatings to render exposed regions more hydrophilic in nature. While this concept was one of the early applications of converting surface characteristics in printing plates, it has the disadvantages of requiring long UV light exposure times (up to 60 minutes), and the plate’s use is in a positive-working mode only.

U.S. Pat. No. 4,405,705 (Etoh et al.) and U.S. Pat. No. 4,548,893 (Lee et al.) describe amine-containing polymers for photosensitive materials used in non-thermal processes. Thermal processes using polyamic acids and vinyl polymers with pendant quaternary ammonium groups are described in U.S. Pat. No. 4,693,958 (Schwartz et al.). U.S. Pat. No. 5,512,418 (Ma) describes the use of polymers having heat-sensitive cationic quaternary ammonium groups. However, the materials described in this art require wet processing after imaging.

WO 92/09934 (Vogel et al.) describes photosensitive compositions containing a photoacid generator and a polymer with acid labile tetrahydropyranyl or activated ester groups. However, imaging of these compositions converts the imaged areas from hydrophobic to hydrophilic in nature.

In addition, EP-A 0 652 483 (Ellis et al.) describes lithographic printing plates imageable using IR lasers, and which do not require wet processing. These plates comprise an imaging layer that becomes more hydrophilic upon imagewise exposure to heat. This coating contains a polymer having pendant groups (such as t-alkyl carboxylates) that are capable of reacting under heat or acid to form more polar, hydrophilic groups. Imaging such compositions converts the imaged areas from hydrophobic to relatively more hydrophilic in nature, and thus requires imaging the background of the plate, which is generally a larger area. This can be a problem when imaging to the edge of the printing plate is desired.

U.S. Pat. No. 5,985,514 (Zheng at al.) is directed to processless direct write printing plates that include an imaging layer containing heat sensitive polymers. The polymer coatings are sensitized to infrared radiation by the incorporation of an infrared absorbing material such as an organic dye or a fine dispersion of carbon black. Upon exposure to a high intensity infrared laser, light absorbed by the organic dye or carbon black is converted to heat, thereby promoting a physical change in the polymer (usually a change in hydrophilicity or hydrophobicity). The resulting printing plates can be used on conventional printing presses to provide, for example, negative images. Such printing plates have utility in the evolving “computer-to-plate” printing market.

Some of the heat-sensitive polymers described in the copending applications, particularly the polymers containing organoonium or other charged groups, have a tendency to undergo physical interactions or chemical reactions with the organic dye or carbon black, thus compromising the effectiveness of both polymers and heat-absorbing materials.

Organic dye salts, by nature, are often partially soluble in water or alcoholic coating solvents and are thus preferred as IR dye sensitizers. However, many such salts have been found to be unacceptable because of insufficient solubility, because they react with the charged polymer to form hydrophobic products that can result in scummed or toned images, or because they offer insufficient thermal sensitization in imaging members. In particular, there is a need to have IR dye sensitizers that are compatible with thiosulfate polymers, such as those described in U.S. Pat. No. 5,985,514 (noted above).

Thus, the graphic arts industry is seeking an alternative means for providing processless, direct-write lithographic imaging members that can be imaged without ablation, or the other problems noted above in relation to known processless direct write printing plates. It would also be desirable to have heat-sensitive imaging members that include IR dye sensitizers that are highly effective to convert light exposure into heat and that are compatible with various charged thermally sensitive polymers, including thiosulfate polymers.

SUMMARY OF THE INVENTION

The problems noted above are overcome with a heat-sensitive composition comprising:

a) a hydrophilic heat-sensitive ionomer, b) water or a water-miscible organic solvent, and c) an infrared radiation sensitive bis(aminoaryl) polymethine dye that is soluble in water or the water-miscible organic solvent and that has a $\lambda_{max}$ greater than 700 nm as measured in water or the water-miscible organic solvent.

This invention also provides an imaging member comprising a support and having disposed thereon a hydrophilic imaging layer that is prepared from the heat-sensitive composition described above.

Still further, this invention includes a method of imaging comprising:

A) providing the imaging member described above, and

B) imagewise exposing the imaging member to provide exposed and unexposed areas in the imaging layer of the imaging member, whereby the exposed areas are rendered more hydrophobic than the unexposed areas by heat provided by the imagewise exposure.

Still again, a method of printing comprises carrying out steps A and B noted above, and additionally:

C) contacting the imagewise exposed imaging member with a lithographic printing ink, and imagewise transferring that printing ink from the imaging member to a receiving material.

As used herein, the term "ionomer" refers to a charged polymer having at least 15 mol % of the recurring units negatively or positively charged. These ionomers are generally referred to as "charged polymers" in the following disclosure.

The imaging members of this invention have a number of advantages, and provide solutions to the problems recognized in previous printing plates. Specifically, the problems and concerns associated with ablation imaging (that is, imagewise removal of a surface layer) are avoided because the hydrophilicity of the imaging layer is changed imagewise by "switching" (preferably, irreversibly) exposed areas of its printing surface to be less hydrophilic (that is, become more hydrophobic when heated). Thus, the imaging layer stays intact during and after imaging (that is, no ablation occurs). These advantages are achieved by using a hydrophilic heat-sensitive polymer having recurring ionic groups within the polymer backbone or chemically attached thereto. Such polymers and groups are described in more detail below. The polymers used in the imaging layer are readily prepared using procedures described herein, and the imaging members of this invention are simple to make and use without the need for post-imaging wet processing. The resulting printing members formed from the imaging members of this invention are generally negative-working in nature.

Charged polymers, such as organoonium or thiosulfate polymers that are used in the practice of this invention are typically coated out of water and methanol, solvents that readily dissolve these water-soluble polymeric salts.

The bis(aminoaryl)polymethine infrared radiation-sensitive dyes ("IR dyes" herein) used in this invention are desired IR sensitizers for thermal imaging members because they can be selected to have maximum absorption at the operating wavelength of a laser platesetter (generally 700 nm or more). Moreover, they can be coated in a dissolved (that is molecularly dispersed) state, providing for maximized utilization of energy as well as maximized image resolution capability. The heat-sensitive compositions of this invention provide good photospeed and produce minimum or no outgassing (reduced gaseous effluents). Furthermore, we have not observed adverse effects from an interaction of charged polymers (particularly thiosulfate polymers) and the bis(aminoaryl)polymethine IR dyes useful in the present invention.

DETAILED DESCRIPTION OF THE INVENTION

The imaging members of this invention comprise a support and one or more layers disposed thereon that include a dried heat-sensitive composition. The support can be any self-supporting material including polymeric films, glass, ceramics, cellulosic materials (including papers), metals or stiff papers, or a lamination of any of these materials. The thickness of the support can be varied. In most applications, the thickness should be sufficient to sustain the wear from printing and thin enough to wrap around a printing form. A preferred embodiment uses a polyester support prepared from, for example, polyethylene terephthalate or polyethylene naphthalate, and having a thickness of from about 100 to about 310 $\mu$m. Another preferred embodiment uses aluminum sheets having a thickness of from about 100 to about 600 $\mu$m. The support should resist dimensional change under conditions of use.

The support may also be a cylindrical support that includes printing cylinders on press as well as printing sleeves that are fitted over printing cylinders. The use of such supports to provide cylindrical imaging members is described in U.S. Pat. No. 5,713,287 (Gelbart). The heat-sensitive composition of this invention can be coated or sprayed directly onto the cylindrical surface (or other support) that is an integral part of the printing press to provide an imaging member on-press.

The support may be coated with one or more "subbing" layers to improve adhesion of the final assemblage. Examples of subbing layer materials include, but are not limited to, gelatin and other naturally occurring and synthetic hydrophilic colloids and vinyl polymers (such as vinylidene chloride copolymers) that are known for such purposes in the photographic industry, vinylphosphonic acid polymers, sol gel materials such as those prepared from alkoxysilanes (including glycidoxypropyltriethoxysilane and aminopropyltriethoxysilane), epoxy functional polymers, and various ceramics.

The backside of the support may be coated with antistatic agents and/or slipping layers or matte layers to improve handling and "feel" of the imaging member.

The imaging members, however, preferably have only one layer on the support, that is a heat-sensitive surface layer that is required for imaging. This hydrophilic layer is prepared from a heat-sensitive composition of this invention and includes one or more heat-sensitive charged polymers and one or more bis(aminoaryl)polymethine IR dyes as a photothermal conversion material (both described below). Because of the particular polymer(s) used in the imaging layer, the exposed (imaged) areas of the layer are rendered more hydrophobic in nature. The unexposed areas remain hydrophilic in nature.

Thus, in the heat-sensitive imaging layer of the imaging member, only the one or more charged polymers and one or more bis(aminoaryl)polymethine IR dyes are essential for imaging. The charged polymers generally are comprised of recurring units, of which at least 15 mol % include ionic groups. Preferably, at least 20 mol % of the recurring groups include ionic groups. Thus each of these polymers has a net charge provided by these ionic groups. Preferably, the ionic groups are anionic groups.

The charged polymers (ionomers) useful in the practice of this invention can be in any of three broad classes of materials:

I) crosslinked or uncrosslinked vinyl polymers comprising recurring units comprising positively-charged, pendant N-alkylated aromatic heterocyclic groups, II) crosslinked or uncrosslinked polymers comprising recurring organoonium groups, and III) polymers comprising a pendant thiosulfate (Bunte salt) group.

Each class of polymers is described in turn. The imaging layer can include mixtures of polymers from each class, or a mixture of one or more polymers of two or more classes. The Class III polymers are preferred.

Class I Polymers

The Class I polymers generally have a molecular weight of at least 1000 and can be any of a wide variety of hydrophilic vinyl homopolymers and copolymers having the requisite positively-charged groups. They are prepared from ethylenically unsaturated polymerizable monomers using any conventional polymerization technique. Preferably, the polymers are copolymers prepared from two or more ethylenically unsaturated polymerizable monomers, at least one of which contains the desired pendant positively-charged group, and another monomer that is capable of providing other properties, such as crosslinking sites and possibly adhesion to the support. Procedures and reactants needed to prepare these polymers are well known. With the additional teaching provided herein, the known polymer reactants and conditions can be modified by a skilled artisan to attach a suitable cationic group.

The presence of a cationic group apparently provides or facilitates the "switching" of the imaging layer from hydrophilic to hydrophobic in the areas that have been exposed to heat in some manner, when the cationic group reacts with its counter ion. The net result is the loss of charge. Such reactions are more easily accomplished when the anion is more nucleophilic and/or more basic. For example, an acetate anion is typically more reactive than a chloride anion. By varying the chemical nature of the anion, the reactivity of the heat-sensitive polymer can be modified to provide optimal image resolution for a given set of conditions (for example, laser hardware and power, and printing press needs) balanced with sufficient ambient shelf life. Useful anions include the halides, carboxylates, sulfates, borates and sulfonates. Representative anions include, but are not limited to, chloride, bromide, fluoride, acetate, tetrafluoroborate, formate, sulfate, p-toluenesulfonate and others readily apparent to one skilled in the art. The halides and carboxylates are preferred.

The aromatic cationic group is present in sufficient recurring units of the polymer so that the heat-activated reaction described above can provide desired hydrophobicity of the imaged printing layer. The groups can be attached along a principal backbone of the polymer, or to one or more branches of a polymeric network, or both. The aromatic groups generally comprise 5 to 10 carbon, nitrogen, sulfur or oxygen atoms in the ring (at least one being a positively-charged nitrogen atom), to which is attached a branched or unbranched, substituted or unsubstituted alkyl group. Thus, the recurring units containing the aromatic heterocyclic group can be represented by the following Structure I:

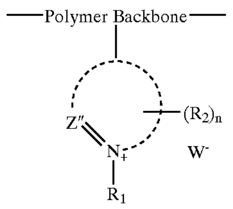

I

In this structure, $R_1$ is a branched or unbranched, substituted or unsubstituted alkyl group having from 1 to 12 carbon atoms (such as methyl, ethyl, n-propyl, isopropyl, t-butyl, hexyl, methoxymethyl, benzyl, neopentyl and dodecyl). Preferably, $R_1$ is a substituted or unsubstituted, branched or unbranched alkyl group having from 1 to 6 carbon atoms, and most preferably, it is substituted or unsubstituted methyl group.

$R_2$ can be a substituted or unsubstituted alkyl group (as defined above, and additionally a cyanoalkyl group, a hydroxyalkyl group or alkoxyalkyl group), a substituted or unsubstituted alkoxy group having 1 to 6 carbon atoms (such as methoxy, ethoxy, isopropoxy, oxymethylmethoxy, n-propoxy and butoxy), a substituted or unsubstituted aryl group having 6 to 14 carbon atoms in the ring (such as phenyl, naphthyl, anthryl, p-methoxyphenyl, xylyl, and alkoxycarbonylphenyl), a substituted or unsubstituted alkenyl group having 2 to 10 carbon atoms), a halo group (such as chloro and bromo), a substituted or unsubstituted cycloalkyl group having 5 to 8 carbon atoms in the ring (such as cyclopentyl, cyclohexyl and 4-methylcyclohexyl), or a substituted or unsubstituted heterocyclic group having 5 to 8 atoms in the ring including at least one nitrogen, sulfur or oxygen atom in the ring (such as pyridyl, pyridinyl, tetrahydrofuranyl and tetrahydropyranyl). Preferably, $R_2$ is a substituted or unsubstituted methyl, ethyl, or n-propyl group.

Z" represents the carbon and any additional nitrogen, oxygen, or sulfur atoms necessary to complete the 5- to 10-membered (preferably 5- to 6-membered) aromatic N-heterocyclic ring that is attached to the polymeric backbone. Thus, the ring can include two or more nitrogen atoms in the ring (for example, N-alkylated diazinium or imidazolium groups), or N-alkylated nitrogen-containing fused ring systems including, but not limited to, pyridinium, quinolinium, isoquinolinium acridinium, phenanthradinium and others readily apparent to one skilled in the art.

$W^-$ is a suitable anion as described above. Most preferably it is acetate or chloride.

Also in Structure I, n is defined as 0 to 6, and is preferably 0 or 1. Most preferably, n is 0.

The aromatic heterocyclic ring can be attached to the polymeric backbone at any position on the ring. Preferably, there are 5 or 6 atoms in the ring, one or two of which are nitrogen. Thus, the N-alkylated nitrogen containing aromatic group is preferably imidazolium or pyridinium and most preferably it is imidazolium.

The recurring units containing the cationic aromatic heterocycle can be provided by reacting a precursor polymer containing unalkylated nitrogen containing heterocyclic units with an appropriate alkylating agent (such as alkyl sulfonate esters, alkyl halides and other materials readily apparent to one skilled in the art) using known procedures and conditions.

Preferred Class I polymers can be represented by the following Structure II that represents random recurring units derived from one or more monomers as described below:

II

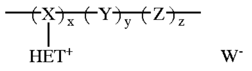

wherein X represents recurring units to which the N-alkylated nitrogen containing aromatic heterocyclic groups (represented by $HET^+$) are attached, Y represents recurring units derived from ethylenically unsaturated polymerizable monomers that may provide active sites for crosslinking using any of various crosslinking mechanisms (described below), and Z represents recurring units derived from any additional ethylenically unsaturated polymerizable monomers. $W^-$ is an anion as described above. The various repeating units are present in suitable amounts, as represented by x being from about 20 to 100 mol %, y being from about 0 to about 20 mol %, and z being from 0 to 80 mol %. Preferably, x is from about 30 to about 98 mol %, y is from about 2 to about 10 mol % and z is from 0 to about 68 mol %.

Crosslinking of the polymers can be provided in a number of ways. There are numerous monomers and methods for crosslinking that are familiar to one skilled in the art. Some representative crosslinking strategies include, but are not necessarily limited to:

a) reacting an amine or carboxylic acid or other Lewis basic units with diepoxide crosslinkers, b) reacting an epoxide units within the polymer with difunctional amines, carboxylic acids, or other difunctional Lewis basic unit, c) irradiative or radical-initiated crosslinking of double bond-containing units such as acrylates, methacrylates, cinnamates, or vinyl groups, d) reacting a multivalent metal salts with ligating groups within the polymer (the reaction of zinc salts with carboxylic acid-containing polymers is an example), e) using crosslinkable monomers that react via the Knoevenagel condensation reaction, such as (2-acetoacetoxy)ethyl acrylate and methacrylate, f) reacting an amine, thiol, or carboxylic acid groups with a divinyl compound [such as bis (vinylsulfonyl) methane] via a Michael addition reaction, g) reacting a carboxylic acid units with crosslinkers having multiple aziridine units, h) reacting a crosslinkers having multiple isocyanate units with amines, thiols, or alcohols within the polymer, i) mechanisms involving the formation of interchain sol-gel linkages [such as the use of the 3-(trimethoxysilyl) propylmethacrylate monomer], j) oxidative crosslinking using an added radical initiator (such as a peroxide or hydroperoxide), k) autooxidative crosslinking, such as employed by alkyd resins, l) sulfur vulcanization, and m) processes involving ionizing radiation.

Monomers having crosslinkable groups or active crosslinkable sites (or groups that can serve as attachment points for crosslinking additives, such as epoxides) can be copolymerized with the other monomers noted above. Such monomers include, but are not limited to, 3-(trimethoxysilyl)propyl acrylate or methacrylate, cinnamoyl acrylate or methacrylate, N-methoxymethyl methacrylamide, N-aminopropylacrylamide hydrochloride, acrylic or methacrylic acid, and hydroxyethyl methacrylate.

Additional monomers that provide the repeating units represented by "Z" in the Structure II above include any useful hydrophilic or oleophilic ethylenically unsaturated polymerizable monomer that may provide desired physical or printing properties to the hydrophilic imaging layer. Such monomers include, but are not limited to, acrylates, methacrylates, isoprene, acrylonitrile, styrene and styrene derivatives, acrylamides, methacrylamides, acrylic or methacrylic acid, and vinyl halides.

Representative Class I polymers and methods for their preparation are described, for example in U.S. Pat. No. 6,190,831 (Leon et al.), incorporated herein by reference. Mixtures of these polymers can also be used.

Class II Polymers

The Class II polymers also generally have a molecular weight of at least 1000. They can be any of a wide variety of vinyl or non-vinyl homopolymers and copolymers.

Non-vinyl polymers of Class II include, but are not limited to, polyesters, polyamides, polyamide-esters, polyarylene oxides and derivatives thereof, polyurethanes, polyxylylenes and derivatives thereof, silicon-based sol gels (solsesquioxanes), polyamidoamines, polyimides, polysulfones, polysiloxanes, polyethers, poly(ether ketones), poly(phenylene sulfide) ionomers, polysulfides, and polybenzimidazoles. Preferably, such non-vinyl polymers are silicon based sol gels, polyarylene oxides, poly (phenylene sulfide) ionomers, or polyxylylenes, and most preferably, they are poly(phenylene sulfide) ionomers. Procedures and reactants needed to prepare all of these types of polymers are well known. With the additional teaching provided herein, the known polymer reactants and conditions can be modified by a skilled artisan to incorporate or attach a suitable cationic organoonium moiety.

Silicon-based sol gels useful in this invention can be prepared as a crosslinked polymeric matrix containing a silicon colloid derived from di-, tri- or tetraalkoxy silanes.

These colloids are formed by methods described in U.S. Pat. No. 2,244,325 (Bird), U.S. Pat. No. 2,574,902 (Bechtold et al.), and U.S. Pat. No. 2,597,872 (Her). Stable dispersions of such colloids can be conveniently purchased from companies such as the DuPont Company. A preferred sol-gel uses N-trimethoxysilylpropyl-N,N,N-trimethylammonium acetate both as the crosslinking agent and as the polymer layer forming material.

The presence of an organoonium moiety that is chemically incorporated into the polymer in some fashion apparently provides or facilitates the "switching" of the imaging layer from hydrophilic to oleophilic in the exposed areas upon exposure to energy that provides or generates heat, when the cationic moiety reacts with its counter ion. The net result is the loss of charge. Such reactions are more easily accomplished when the anion of the organoonium moiety is more nucleophilic and/or more basic, as described above for the Class I polymers.

The organoonium moiety within the polymer can be chosen from a trisubstituted sulfur moiety (organosulfonium), a tetrasubstituted nitrogen moiety (organoammonium), or a tetrasubstituted phosphorous moiety (organophosphonium). The tetrasubstituted nitrogen (organoammonium) moieties are preferred. This moiety can be chemically attached to (that is, pendant) the polymer backbone, or incorporated within the backbone in some fashion, along with the suitable counter ion. In either embodiment, the organoonium moiety is present in sufficient repeating units of the polymer (at least 20 mol %) so that the heat-activated reaction described above can occur to provide desired hydrophobicity of the imaging layer. When chemically attached as a pendant group, the organoonium moiety can be attached along a principal backbone of the polymer, or to one or more branches of a polymeric network, or both. When chemically incorporated within the polymer backbone, the moiety can be present in either cyclic or acyclic form, and can also form a branching point in a polymer network. Preferably, the organoonium moiety is provided as a pendant group along the polymeric backbone. Pendant organoonium moieties can be chemically attached to the polymer backbone after polymer formation, or functional groups on the polymer can be converted to organoonium moieties using known chemistry. For example, pendant quaternary ammonium groups can be provided on a polymeric backbone by the displacement of a "leaving group" functionality (such as a halogen) by a tertiary amine nucleophile. Alternatively, the organoonium group can be present on a monomer that is then polymerized or derived by the alkylation of a neutral heteroatom unit (trivalent nitrogen or phosphorous group or divalent sulfur group) already incorporated within the polymer.

The organoonium moiety is substituted to provide a positive charge. Each substituent must have at least one carbon atom that is directly attached to the sulfur, nitrogen or phosphorus atom of the organoonium moiety. Useful substituents include, but are not limited to, substituted or unsubstituted alkyl groups having 1 to 12 carbon atoms and preferably from 1 to 7 carbon atoms (such as methyl, ethyl, n-propyl, isopropyl, t-butyl, hexyl, methoxyethyl, isopropoxymethyl, substituted or unsubstituted aryl groups (phenyl, naphthyl, p-methylphenyl, m-methoxyphenyl, p-chlorophenyl, p-methylthiophenyl, p-N,N-dimethylaminophenyl, xylyl, methoxycarbonylphenyl and cyanophenyl), and substituted or unsubstituted cycloalkyl groups having 5 to 8 carbon atoms in the carbocyclic ring (such as cyclopentyl, cyclohexyl, 4-methylcyclohexyl and 3-methylcyclohexyl). Other useful substituents would be readily apparent to one skilled in the art, and any combination of the expressly described substituents is also contemplated.

The organoonium moieties include any suitable anion as described above for the Class I polymers. The halides and carboxylates are preferred.

Representative Class II non-vinyl polymers and methods for their preparation are described in U.S. Pat. No. 6,190,831 (noted above), incorporated herein by reference. Mixtures of these polymers can also be used.

In addition, vinyl Class II polymers can be used in the practice of this invention. Like the non-vinyl polymers, such heat-sensitive polymers are composed of recurring units having one or more types of organoonium group. For example, such a polymer can have recurring units with both organoammonium groups and organosulfonium groups. It is also not necessary that all of the organoonium groups have the same alkyl substituents. For example, a polymer can have recurring units having more than one type of organoammonium group. Useful anions in these polymers are the same as those described above for the non-vinyl polymers. In addition, the halides and carboxylates are preferred.

The organoonium group is present in sufficient recurring units of the polymer so that the heat-activated reaction described above can occur to provide desired hydrophobicity of the imaged printing layer. The group can be attached along a principal backbone of the polymer, or to one or more branches of a polymeric network, or both. Pendant groups can be chemically attached to the polymer backbone after polymer formation using known chemistry. For example, pendant organoammonium, organophosphonium or organosulfonium groups can be provided on a polymeric backbone by the nucleophilic displacement of a pendant leaving group (such as a halide or sulfonate ester) on the polymeric chain by a trivalent amine, divalent sulfur or trivalent phosphorous nucleophile. Pendant onium groups can also be provided by alkylation of corresponding pendant neutral heteroatom groups (nitrogen, sulfur or phosphorous) using any commonly used alkylating agent such as alkyl sulfonate esters or alkyl halides. Alternatively a monomer precursor containing the desired organoammonium, organophosphonium or organosulfonium group may be polymerized to yield the desired polymer.

The organoammonium, organophosphonium or organosulfonium group in the vinyl polymer provides the desired positive charge. Generally, preferred pendant organoonium groups can be illustrated by the following Structures III, IV and V:

III

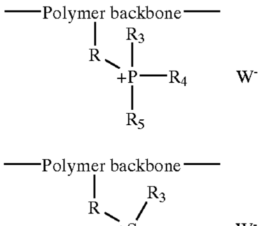

IV

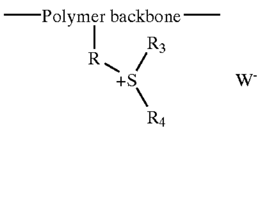

-continued

V

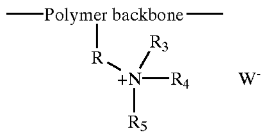

wherein R is a substituted or unsubstituted alkylene group having 1 to 12 carbon atoms that can also include one or more oxy, thio, carbonyl, amido or alkoxycarbonyl groups with the chain (such as methylene, ethylene, isopropylene, methylenephenylene, methyleneoxymethylene, n-butylene and hexylene), a substituted or unsubstituted arylene group having 6 to 10 carbon atoms in the ring (such as phenylene, naphthylene, xylylene and 3-methoxyphenylene), or a substituted or unsubstituted cycloalkylene group having 5 to 10 carbon atoms in the ring (such as 1,4-cyclohexylene, and 3-methyl-1,4-cyclohexylene). In addition, R can be a combination of two or more of the defined substituted or unsubstituted alkylene, arylene and cycloalkylene groups. Preferably, R is a substituted or unsubstituted ethyleneoxycarbonyl or phenylenemethylene group. Other useful substituents not listed herein could include combinations of any of those groups listed above as would be readily apparent to one skilled in the art.

$R_3$, $R_4$ and $R_5$ are independently substituted or unsubstituted alkyl group having 1 to 12 carbon atoms (such as methyl, ethyl, n-propyl, isopropyl, t-butyl, hexyl, hydroxymethyl, methoxymethyl, benzyl, methylenecarboalkoxy and a cyanoalkyl), a substituted or unsubstituted aryl group having 6 to 10 carbon atoms in the carbocyclic ring (such as phenyl, naphthyl, xylyl, p-methoxyphenyl, p-methylphenyl, m-methoxyphenyl, p-chlorophenyl, p-methylthiophenyl, p-N,N-dimethylaminophenyl, methoxycarbonylphenyl and cyanophenyl), or a substituted or unsubstituted cycloalkyl group having 5 to 10 carbon atoms in the carbocyclic ring (such as 1,3- or 1,4-cyclohexyl). Alternatively, any two of $R_3$, $R_4$ and $R_5$ can be combined to form a substituted or unsubstituted heterocyclic ring with the charged phosphorus, sulfur or nitrogen atom, the ring having 4 to 8 carbon, nitrogen, phosphorus, sulfur or oxygen atoms in the ring. Such heterocyclic rings include, but are not limited to, substituted or unsubstituted morpholinium, piperidinium, and pyrrolidinium groups for Structure V. Other useful substituents for these various groups would be readily apparent to one skilled in the art, and any combinations of the expressly described substituents are also contemplated.

Preferably, $R_3$, $R_4$ and $R_5$ are independently substituted or unsubstituted methyl or ethyl groups.

$W^{31}$ is any suitable anion as described above for the Class I polymers. Acetate and chloride are preferred anions.

Polymers containing quaternary ammonium groups as described herein are most preferred vinyl Class II polymers.

The vinyl Class II polymers useful in the practice of this invention can be represented by the following Structure VI that represents random recurring units derived from one or more monomers as described below:

VI

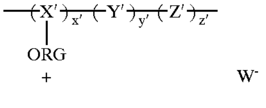

wherein X' represents recurring units to which the organoonium groups ("ORG") are attached, Y' represents recurring units derived from ethylenically unsaturated polymerizable monomers that may provide active sites for crosslinking using any of various crosslinking mechanisms (described below), and Z' represents recurring units derived from any additional ethylenically unsaturated polymerizable monomers. The various recurring units are present in suitable amounts, as represented by x' being from about 20 to about 99 mol %, y' being from about 1 to about 20 mol %, and z' being from 0 to about 79 mol %. Preferably, x' is from about 30 to about 98 mol %, y' is from about 2 to about 10 mol %, and z' is from 0 to about 68 mol %.

Crosslinking of the vinyl polymer can be achieved in the same way as described above for the Class I polymers.

Additional monomers that provide the additional recurring units represented by Z' in Structure VI include any useful hydrophilic or oleophilic ethylenically unsaturated polymerizable monomer that may provide desired physical or printing properties to the imaging layer. Such monomers include, but are not limited to, acrylates, methacrylates, acrylonitrile, isoprene, styrene and styrene derivatives, acrylamides, methacrylamides, acrylic or methacrylic acid, and vinyl halides.

Representative vinyl polymers of Class II are also described in U.S. Pat. No. 6,190,830 (Leon et al.). A mixture of any two or more of these polymers can also be used.

Class III Polymers

Each of the Class III polymers has a molecular weight of at least 1000, and preferably of at least 5000. For example, the polymers can be vinyl homopolymers or copolymers prepared from one or more ethylenically unsaturated polymerizable monomers that are reacted together using known polymerization techniques and reactants. Alternatively, they can be addition homopolymers or copolymers (such as polyethers) prepared from one or more heterocyclic monomers that are reacted together using known polymerization techniques and reactants. Additionally, they can be condensation type polymers (such as polyesters, polyimides, polyamides or polyurethanes) prepared using known polymerization techniques and reactants. Whatever the type of polymers, at least 15 mol % (preferably 20 mol %) of the total recurring units in the polymer comprise the necessary heat-activatable thiosulfate groups.

The Class III polymers useful in the practice of this invention can be represented by the Structure VII wherein the thiosulfate group (or Bunte salt) is a pendant group:

VII

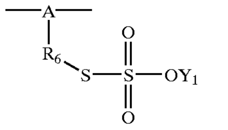

wherein A represents a polymeric backbone, $R_6$ is a divalent linking group, and $Y_1$ is hydrogen or a cation.

Useful polymeric backbones include, but are not limited to, vinyl polymers, polyethers, polyimides, polyamides, polyurethanes and polyesters. Preferably, the polymeric backbone is a vinyl polymer or polyether.

Useful $R_6$ linking groups include $—(COO)_p(Z_1)_m—$ wherein p is 0 or 1, m is 0 or 1, and $Z_1$ is a substituted or unsubstituted alkylene group having 1 to 6 carbon atoms (such as methylene, ethylene, n-propylene, isopropylene, butylenes, 2-hydroxypropylene, and 2-hydroxy-4-azahexylene) that can have one or more oxygen, nitrogen or sulfur atoms in the chain, a substituted or unsubstituted arylene group having 6 to 14 carbon atoms in the aromatic ring (such as phenylene, naphthalene, anthracylene, and xylylene), or a substituted or unsubstituted arylenealkylene (or alkylenearylene) group having 7 to 20 carbon atoms in the chain (such as p-methylenephenylene, phenylenemethylenephenylene, biphenylene, and phenyleneisopropylenephenylene). In addition, $R_6$ can be an alkylene group, an arylene group, in an arylenealkylene group as defined above for $Z_1$.

Preferably, $R_6$ is a substituted or unsubstituted of alkylene group of 1 to 3 carbon atoms, a substituted or unsubstituted arylene group of 6 carbon atoms in the aromatic ring, an arylenealkylene group of 7 or 8 carbon atoms in the chain, or —$COOZ_1$— wherein $Z_1$ is methylene, ethylene, or phenylene. Most preferably, $R_6$ is phenylene, methylene, or —COO—.

$Y_1$ is hydrogen, ammonium ion, or a metal ion (such as sodium, potassium, magnesium, calcium, cesium, barium, zinc, or lithium ion). Preferably, $Y_1$ is hydrogen, sodium ion, or potassium ion.

As the thiosulfate group is generally pendant to the backbone, preferably it is part of an ethylenically unsaturated polymerizable monomer that can be polymerized using conventional techniques to form vinyl homopolymers of the thiosulfate-containing recurring units, or vinyl copolymers when copolymerized with one or more additional ethylenically unsaturated polymerizable monomers. The thiosulfate-containing recurring units generally comprise at least 15 mol % of all recurring units in the polymer, preferably they comprise from about 20 to 100 mol % of all recurring units. A polymer can include more than one type of repeating unit containing a thiosulfate group as described herein.

Polymers having the above-described thiosulfate group are believed to crosslink and to switch from hydrophilic thiosulfate to hydrophobic disulfide (upon loss of sulfate) with heating.

Thiosulfate-containing molecules (or Bunte salts) can be prepared from the reaction between an alkyl halide and thiosulfate salt as taught by Bunte *Chem. Ber.* 7, 646, 1884. Polymers containing thiosulfate groups can either be prepared from functional monomers or from preformed polymers. Polymers can also be prepared from preformed polymers in a similar manner as described in U.S. Pat. No. 3,706,706 (Vandenberg). Thiosulfate-containing molecules can also be prepared by reaction of an alkyl epoxide with a thiosulfate salt, or between an alkyl epoxide and a molecule containing a thiosulfate moiety (such as 2-aminoethanethiosulfuric acid), and the reaction can be performed either on a monomer or polymer as illustrated by Thames, *Surf. Coating,* 3 (Waterborne Coat.), Chapter 3, pp. 125–153, Wilson et al (Eds.).

Representative ethylenically unsaturated polymerizable monomers, Class III polymers and methods of making there are described in U.S. Pat. No. 5,985,514 (noted above), incorporated herein by reference.

Vinyl polymers can be prepared by copolymerizing monomers containing the thiosulfate functional groups with one or more other ethylenically unsaturated polymerizable monomers to modify polymer chemical or functional properties, to optimize imaging member performance, or to introduce additional crosslinking capability.

Useful additional ethylenically unsaturated polymerizable monomers include, but are not limited to, acrylates (including methacrylates) such as ethyl acrylate, n-butyl acrylate, methyl methacrylate and t-butyl methacrylate, acrylamides (including methacrylamides), an acrylonitrile (including methacrylonitrile), vinyl ethers, styrenes, vinyl acetate, dienes (such as ethylene, propylene, 1,3-butadiene and isobutylene), vinyl pyridine, and vinylpyrrolidone. Acrylamides, acrylates, and styrenes are preferred.

The imaging layer of the imaging member can include one or more Class I, II or III polymers with or without minor amounts (less than 20 weight %, based on total dry weight of the layer) of additional binder or polymeric materials that will not adversely affect its imaging properties.

The following polymers are representative of those useful in the practice of the present invention. Polymers 1, 3–6 are illustrative of Class I polymers (Polymer 2 is a precursor to Polymer 3), Polymers 7–8 and 10 are illustrative of Class II non-vinyl polymers (Polymer 9 is a precursor to Polymer 10), Polymers 11–18 are illustrative of Class II vinyl polymers, and Polymers 19, 22, 24–26, 28, and 29 are illustrative of Class III polymers.

Polymer 1: Poly (1-vinyl-3-methylimidazolium chloride-co-N-(3-aminopropyl)methacrylamide hydrochloride), Polymer 2: Poly(methyl methacrylate-co-4-vinylpyridine) (9:1 molar ratio), Polymer 3: Poly(methyl methacrylate-co-N-methyl-4-vinylpyridinium formate) (9:1 molar ratio), Polymer 4: Poly(methyl methacrylate-co-N-butyl-4-vinylpyridinium formate) (9:1 molar ratio), Polymer 5: Poly(methyl methacrylate-co-2-vinylpyridine) (9:1 molar ratio), Polymer 6: Poly(methyl methacrylate-co-N-methyl-2-vinylpyridinium formate) (9:1 molar ratio), Polymer 7: Poly(p-xylidenetetrahydro-thiophenium chloride), Polymer 8: Poly[phenylene sulfide-co-methyl(4-thiophenyl) sulfonium chloride], Polymer 9: Brominated poly(2,6-dimethyl-1,4-phenylene oxide), Polymer 10: Dimethyl sulfonium bromide derivative of poly(2,6-dimethyl-1,4-phenylene oxide), Polymer 11: Poly[methyl methacrylate-co-2-trimethylammoniumethyl methacrylic chloride-co-N-(3-aminopropyl) methacrylamide hydrochloride] (7:2:1 molar ratio), Polymer 12: Poly[methyl methacrylate-co-2-trimethylammoniumethyl methacrylic acetate-co-N-(3-aminopropyl) methacrylamide] (7:2:1 molar ratio), Polymer 13: Poly[methyl methacrylate-co-2-trimethylammoniumethyl methacrylic fluoride-co-N-(3-aminopropyl) methacrylamide hydrochloride] (7:2:1 molar ratio), Polymer 14: Poly[vinylbenzyl trimethylammonium chloride-co-N-(3-aminopropyl) methacrylamide hydrochloride] (19:1 molar ratio), Polymer 15: Poly([vinylbenzyltrimethyl-phosphonium acetate-co-N-(3-aminopropyl) methacrylamide hydrochloride] (19:1 molar ratio), Polymer 16: Poly [dimethyl-2-(methacryloyloxy) ethylsulfonium chloride-co-N-(3-aminopropyl) methacrylamide hydrochloride] (19:1 molar ratio), Polymer 17: Poly [vinylbenzyldimethylsulfonium methylsulfate], Polymer 18: Poly[vinylbenzyldimethylsulfonium chloride], Polymer 19: Poly(chloromethyl-ethylene oxide-co-sodium thiosulfate methyl-ethylene oxide), Polymer 22: Poly(vinyl benzyl thiosulfate sodium salt-co-methyl methacylate), Polymer 24: Poly[vinyl benzyl thiosulfate sodium salt-co-N-(3-aminopropyl)methacrylamide hydrochloride], Polymer 25: Poly(vinyl benzyl thiosulfate sodium salt), Polymer 26: Poly(2-sodium thiosulfate-ethyl methacrylate), Polymer 28: Poly(2-hydroxy-3-sodium thiosulfate-propyl methacrylate-co-2-(methacryloyloxy)ethyl acetoacetate), and Polymer 29: Poly(4-aza-2-hydroxy-6-sodium thiosulfate-hexyl methacrylate).

In the heat-sensitive composition of this invention used to provide the heat-sensitive layer, the amount of charged polymer is generally present in an amount of at least 1 weight %, and preferably at least 2 weight % (% solids). A practical upper limit of the amount of charged polymer in the composition is about 10 weight %.

The amount of charged polymer(s) used in the imaging layer is generally at least 0.1 g/m$^2$, and preferably from about 0.1 to about 10 g/m$^2$ (dry weight). This generally provides an average dry thickness of from about 0.1 to about 10 $\mu$m.

The imaging layer can also include one or more conventional surfactants for coatability or other properties, dyes or colorants to allow visualization of the written image, or any other addenda commonly used in the lithographic art, as long as the concentrations are low enough so they are inert with respect to imaging or printing properties.

It is essential that the heat-sensitive imaging layer includes one or more photothermal conversion materials to absorb appropriate radiation from an appropriate energy source (such as a laser), which radiation is converted into heat. Thus, such materials convert photons into heat. Preferably, the radiation absorbed is in the infrared and near-infrared regions of the electromagnetic spectrum. The photothermal conversion materials useful in this invention are bis(aminoaryl)polymethine IR dyes. This class of polymethine dyes are known and disclosed by Tuemmler et al., *J. Am. Chem. Soc.* 80, 3772 (1958), Lorenz et al., *Helv. Chem. Acta.* 28, 600, (1945), U.S. Pat. No. 2,813,802 (Ingle), U.S. Pat. No. 2,992,938 (McCarville), U.S. Pat. No. 3,099,630 (Wildi et al.), U.S. Pat. No. 3,275,442 (Kosenkranius), U.S. Pat. No. 3,436,353 (Dreyer et al.), U.S. Pat. No. 4,547,444 (Bell et al.), U.S. Pat. No. 4,950,639 (DeBoer et al.), U.S. Pat. No. 5,135,842 (Kitchin et al.), and EP-A 0 652 483 (Ellis et al.).

It is also essential that the bis(aminoaryl)polymethine IR dye be soluble in water or any of the water-miscible organic solvents that are described below as useful for preparing heat-sensitive compositions. Preferably, the IR dyes are soluble in water, methanol, ethanol, 1-methoxy-2-propanol, methyl ethyl ketone, acetone, acetonitrile, tetrahydrofuran, N,N-dimethylformamide, butyrolactone, or a mixture of these solvents. Solubility in water or the water-miscible organic solvents means that the bis(aminoaryl)polymethine IR dye can be dissolved at a concentration of at least 0.5 g/l at room temperature at room temperature.

The bis(aminoaryl)polymethine IR dyes are sensitive to radiation in the near-infrared and infrared regions of the electromagnetic spectrum. Thus, they generally have a $\lambda_{max}$ at or above 700 nm (preferably a $\lambda_{max}$ of from about 750 to about 900 nm, and more preferably a $\lambda_{max}$ of from about 800 to about 850 nm).

The bis(aminoaryl)polymethine IR dyes useful in this invention are generally cationic dyes having a polymethine chain conjugated with 2 aminoaryl groups, one of which is positively charged. The structures of such dyes can vary as would be will understood by one skilled in the dye art. Such a person would be able to synthesize a useful bis(aminoaryl) polymethine IR dye that is soluble in a suitable solvent and that has the appropriate $\lambda_{max}$ that can be provided by a suitable combination of the length of the methine linkage, the groups to which it is attached. For example, generally the useful bis(aminoaryl)polymethine IR dyes have a methine linkage comprising at least 2 carbon-carbon double bonds in the conjugated chain. Preferably, the methine linkage has at least 3 carbon-carbon double bonds in the conjugated chain.

Particularly useful bis(aminoaryl)polymethine IR dyes useful in the practice of this invention include, but are not limited to, the compounds represented by the following Structure DYE I:

DYE I

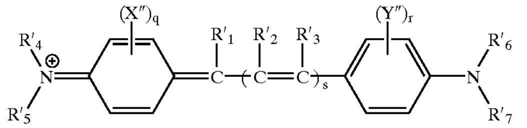

$Z_2$ wherein $R_1'$, $R_2'$, and $R_3'$ each independently represents hydrogen, or a halo, cyano, substituted or unsubstituted alkoxy (having 1 to 8 carbon atoms, both linear and branched alkoxy groups), substituted or unsubstituted aryloxy (having 6 to 10 carbon atoms in the carbocyclic ring), substituted or unsubstituted acyloxy (having 2 to 6 carbon atoms), carbamoyl, substituted or unsubstituted acyl, substituted or unsubstituted acylamido, substituted or unsubstituted alkylamino (having at least one carbon atom), substituted or unsubstituted carbocyclic aryl groups (having 6 to 10 carbon atoms in the aromatic ring, such as phenyl and naphthyl groups), substituted or unsubstituted alkyl groups (having 1 to 8 carbon atoms, both linear and branched isomers), substituted or unsubstituted arylamino, or substituted or unsubstituted heteroaryl (having at least 5 carbon and heteroatoms in the ring) group. Alternatively, any two of $R_1'$, $R_2'$, and $R_3'$ groups may be joined together or with an adjacent aromatic ring to complete a 5- to 7-membered substituted or unsubstituted carbocyclic or heterocyclic ring.

Preferably, $R_1'$, $R_2'$, and $R_3'$ are independently hydrogen, a substituted or unsubstituted carbocyclic aryl group, and a substituted or unsubstituted heteroaryl group, and more preferably, they are independently hydrogen or a substituted phenyl group.

$R_4'$, $R_5'$, $R_6'$, and $R_7'$ each independently represents hydrogen, a substituted or unsubstituted alkyl group (having 1 to 10 carbon atoms), a substituted or unsubstituted cycloalkyl group (having from 4 to 6 carbon atoms in the ring), a substituted or unsubstituted aryl group (having at least 6 carbon atoms in the ring), or a substituted or unsubstituted heteroaryl group (having 5 to 10 carbon and heteroatoms in the ring).

Alternatively, $R_4'$ and $R_5'$ or $R_6'$ and $R_7'$ can be joined together to form a substituted or unsubstituted 5- to 9-membered heterocyclic ring, or $R_4'$, $R_5'$, $R_6'$, or $R_7'$ can be joined to the carbon atom of the adjacent aromatic ring at a position ortho to the position of attachment of the anilino nitrogen to form, along with the nitrogen to which they are attached, a substituted or unsubstituted 5- or 6-membered heterocyclic ring.

Preferably, $R_4'$, $R_5'$, $R_6'$, and $R_7'$ are independently a substituted or unsubstituted alkyl group, a substituted or unsubstituted cycloalkyl group, a substituted or unsubstituted aryl group, or $R_4'$ and $R_5'$ or $R_6'$ and $R_7'$ can be joined together to form a substituted or unsubstituted 5- to 7-membered heterocyclic ring. More preferably, they are independently substituted or unsubstituted alkyl groups of 1 to 8 carbon atoms, substituted or unsubstituted phenyl groups, or $R_4'$ and $R_5'$ or $R_6'$ and $R_7'$ can be joined together to form a substituted or unsubstituted 5- to 7-membered heteroaryl group.

In the DYE I structure, s is an integer from 1 to 4, $Z_2$ is a monovalent anion, X" and Y" are each independently $R_1'$ or the atoms necessary to complete a substituted or unsubstituted 5- to 7-membered fused carbocyclic or heterocyclic ring, and q and r are independently integers from 1 to 4 (preferably from 1 or 2).

Preferably, s is 1 to 3, and X" and Y" are independently hydrogen or the carbon and heteroatoms needed to provide a fused aryl or heteroaryl ring.

Useful bis(aminoaryl)polymethine IR dyes can be synthesized using general procedures described below. The dyes may be provided for incorporation into the heat-sensitive formulations of this invention in any suitable manner. In a preferred embodiment, the dyes are dissolved in a suitable organic solvent.

Examples of such useful bis(aminoaryl)polymethine IR dyes include, but are not limited to, the following compounds (including $\lambda_{max}$ and extinction coefficient in acetone, where known):

DYE 1

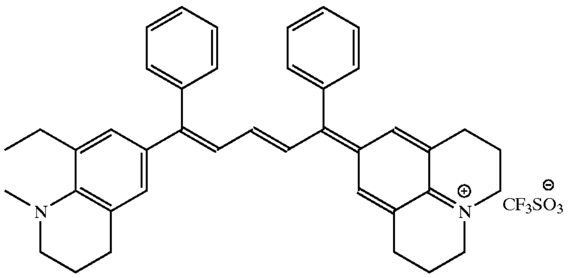

(880 nm, 1.26 x $10^{-5}$)

DYE 2

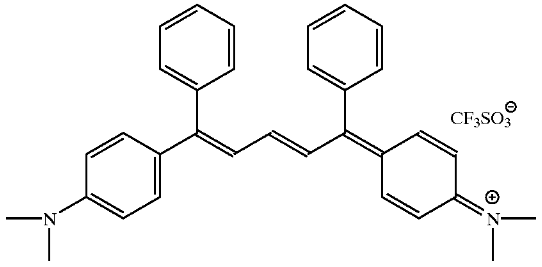

(830 nm, 1.2 x $10^{-5}$)

DYE 3

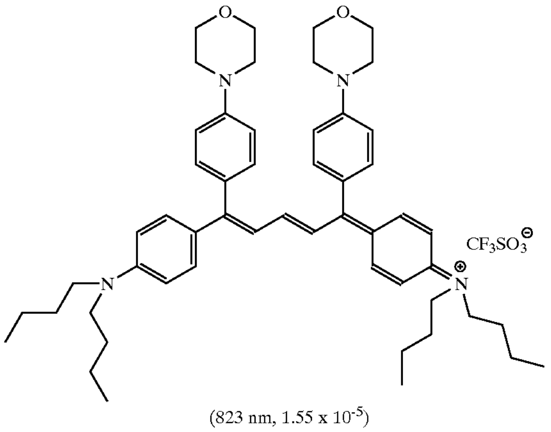

(823 nm, 1.55 x $10^{-5}$)

DYE 4

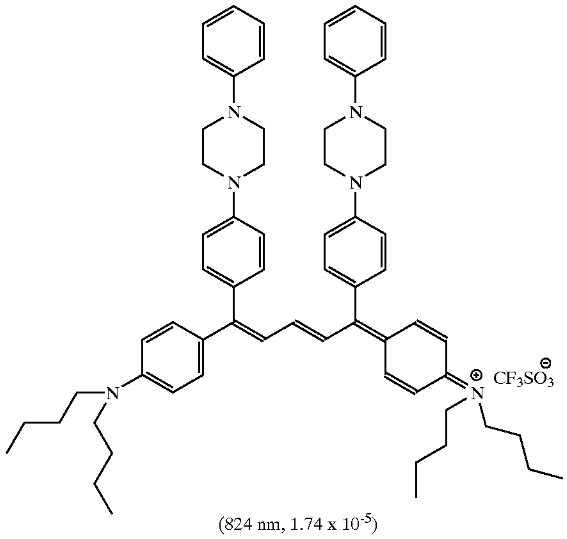

(824 nm, 1.74 x $10^{-5}$)

-continued
DYE 5
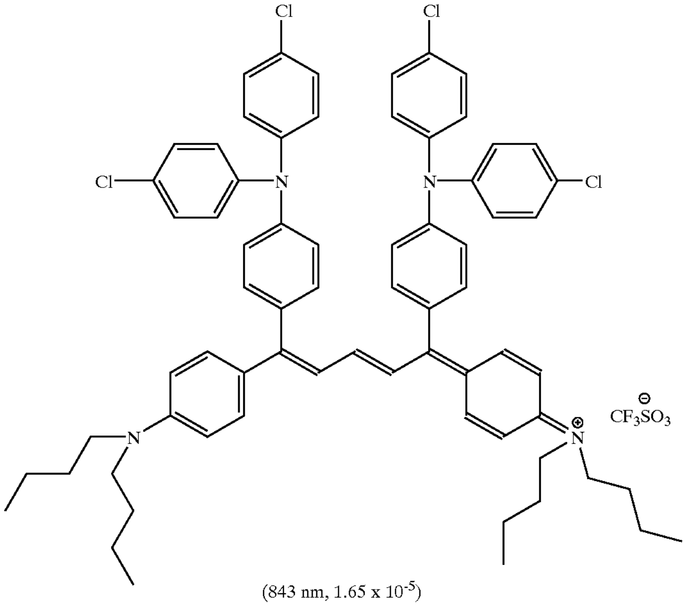
(843 nm, 1.65 x $10^{-5}$)
DYE 6
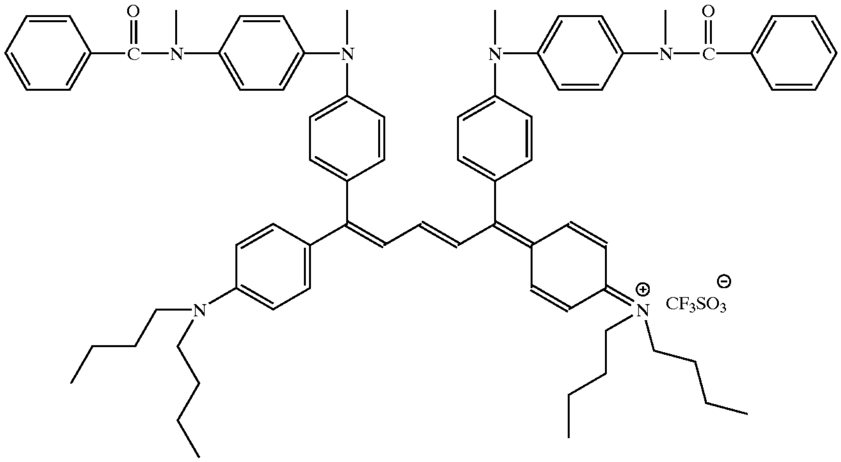
DYE 7
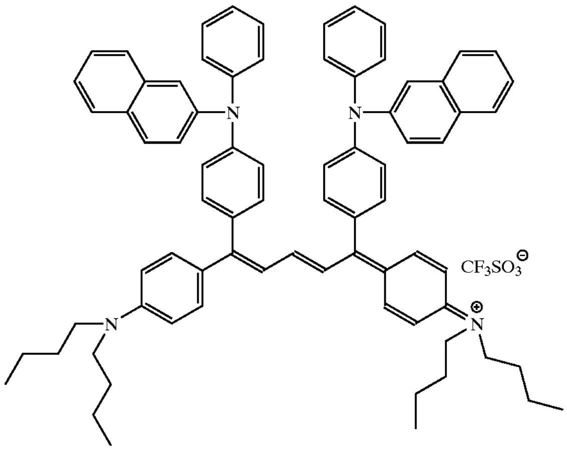
(842 nm, 8.9 x $10^{-4}$)
DYE 8
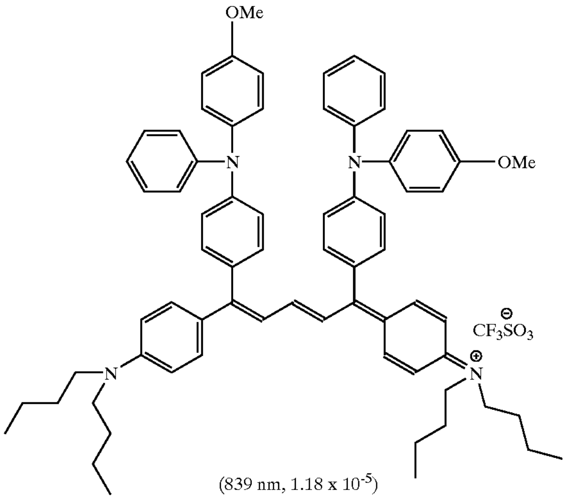
(839 nm, 1.18 x $10^{-5}$)

-continued
DYE 9
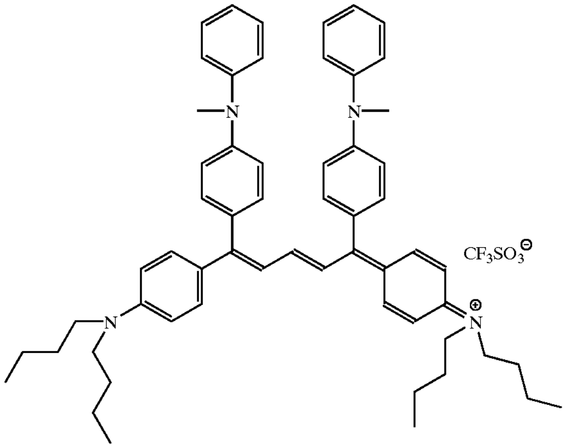
DYE 10
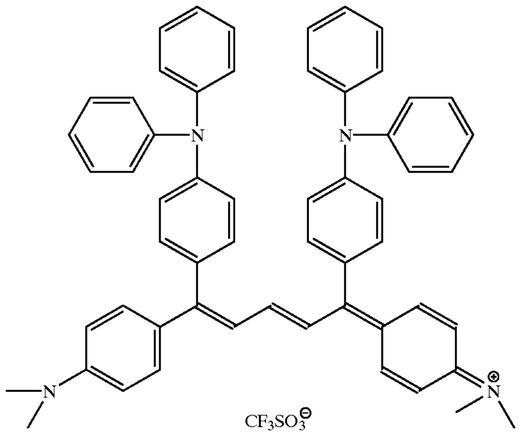
(838 nm, 1.0 x $10^{-5}$)
DYE 11
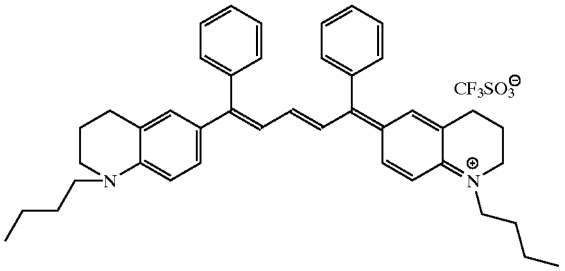
(860 nm, 9.6 x $10^{-4}$)
DYE 12
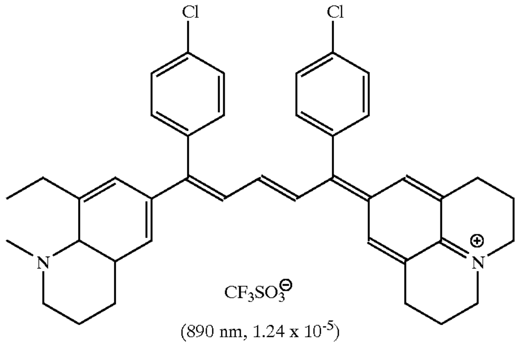
(890 nm, 1.24 x $10^{-5}$)
DYE 13
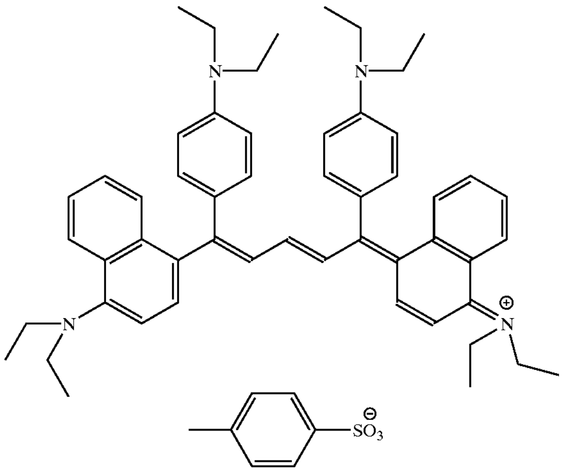
DYE 14
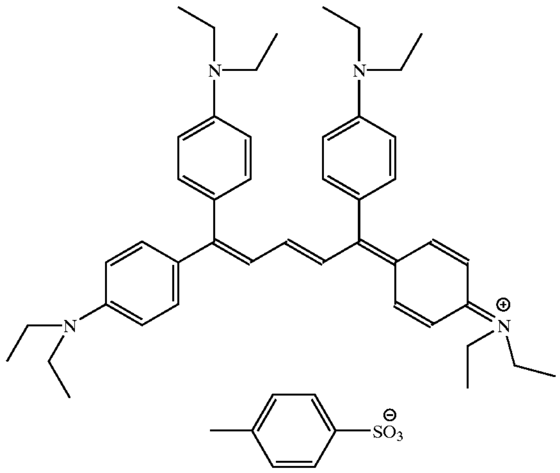

-continued

DYE 15

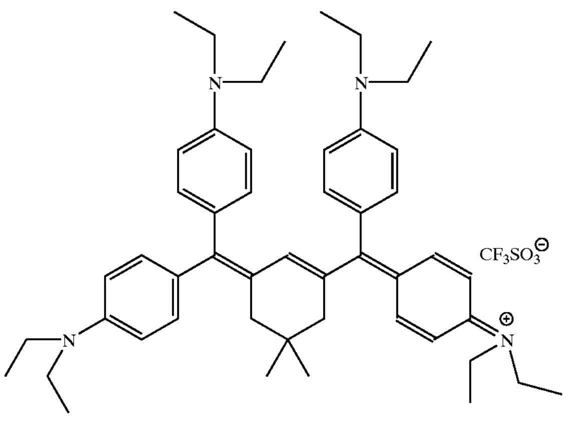

DYE 16

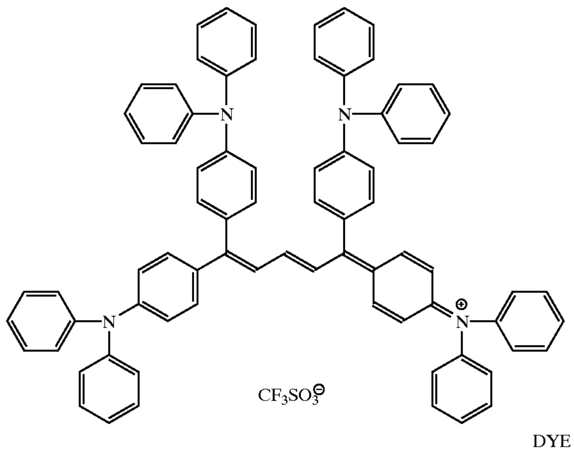

DYE 17

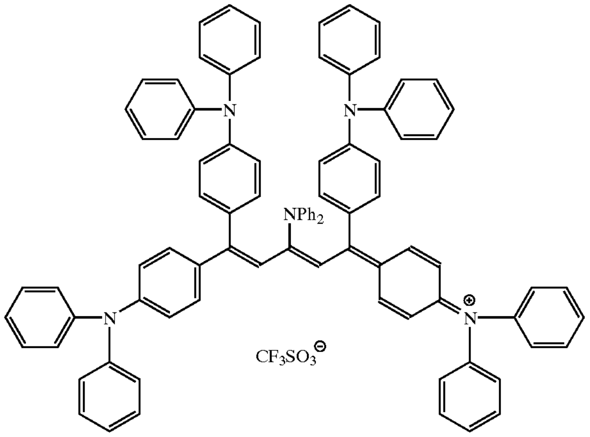

DYE 18

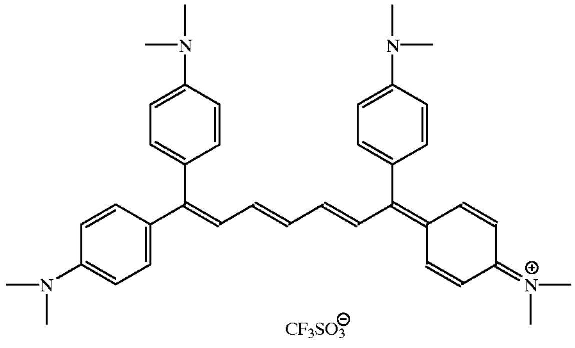

DYE 19

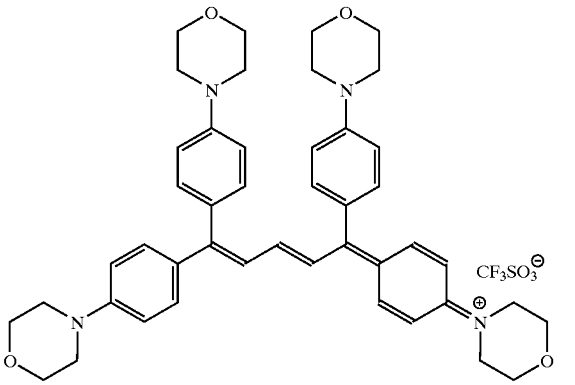

DYE 20

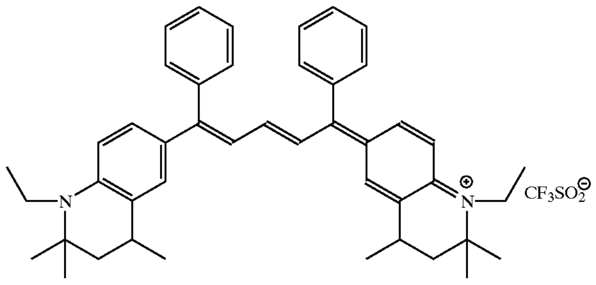

The most preferred IR sensitive dyes useful in this invention are DYES 2, 3, and 7. DYE 7 is most preferred.

The one or more bis(aminoaryl)polymethine IR dyes are present in the heat-sensitive or thermal imaging composition of this invention in an amount of generally at least 0.2 weight % (% solids), and preferably at least 0.4 weight %. The upper limit of bis(aminoaryl)polymethine IR dye is not critical but is governed by the IR dye cost, desired thermal sensitivity and solvent solubility. A practical limit may be about 1 weight %. The amount of IR dye is provided in the heat-sensitive imaging layer of an imaging member sufficient to provide a transmission optical density of at least 0.1, and preferably of at least 0.3 when exposed to radiation having a $\lambda_{max}$ of 830 nm.

The heat-sensitive compositions and imaging layers can include additional photothermal conversion materials, although the presence of such materials is not preferred. Such optional materials can be other IR dyes, carbon black, polymer-grafted carbon, pigments, evaporated pigments, semiconductor materials, alloys, metals, metal oxides, metal sulfides or combinations thereof, or a dichroic stack of materials that absorb radiation by virtue of their refractive index and thickness. Borides, carbides, nitrides, carbonitrides, bronze-structured oxides and oxides structurally related to the bronze family but lacking the $WO_{2.9}$ component, are also useful. Useful absorbing dyes for near infrared diode laser beams are described, for example, in U.S. Pat. No. 4,973,572 (DeBoer). Particular dyes of interest are "broad band" dyes, that is those that absorb over a wide band of the spectrum.

Alternatively, the same or different photothermal conversion material (including an bis(aminoaryl)polymethine IR dye described herein) can be provided in a separate layer that is in thermal contact with the heat-sensitive imaging layer. Thus, during imaging, the action of the additional photothermal conversion material can be transferred to the heat-sensitive imaging layer.

The heat-sensitive composition of this invention can be applied to a support using any suitable equipment and procedure, such as spin coating, knife coating, gravure coating, dip coating or extrusion hopper coating. In addition, the composition can be sprayed onto a support, including a cylindrical support, using any suitable spraying means for example as described in U.S. Pat. No. 5,713,287 (noted above).

The heat-sensitive compositions of this invention are generally formulated in and coated from water or water-miscible organic solvents including, but not limited to, water-miscible alcohols (for example, methanol, ethanol, isopropanol, 1-methoxy-2-propanol, and n-propanol), methyl ethyl ketone, tetrahydrofuran, acetonitrile, N-N-dimethylformamide, butyrolactone, and acetone. Water, methanol, ethanol and 1-methoxy-2-propanol are preferred. Mixtures (such as a mixture of water and methanol) of two or more of these solvents can also be used if desired. By "water-miscible" is meant that the solvent is soluble in water at all proportions at room temperature.

The imaging members of this invention can be of any useful form including, but not limited to, printing plates, printing cylinders, printing sleeves and printing tapes (including flexible printing webs), all of any suitable size or dimensions. Preferably, the imaging members are printing plates or on-press cylinders.

During use, the imaging member of this invention is exposed to a suitable source of energy that generates or provides heat, such as a focused laser beam or a thermoresistive head, in the foreground areas where ink is desired in the printed image, typically from digital information supplied to the imaging device. A laser used to expose the imaging member of this invention is preferably a diode laser, because of the reliability and low maintenance of diode laser systems, but other lasers such as gas or solid state lasers may also be used. The combination of power, intensity and exposure time for laser imaging would be readily apparent to one skilled in the art. Specifications for lasers that emit in the near-IR region, and suitable imaging configurations and devices are described in U.S. Pat. No. 5,339,737 (Lewis et al.), incorporated herein by reference with respect to such imaging devices. The imaging member is typically sensitized so as to maximize responsiveness at the emitting wavelength of the laser.

The imaging apparatus can operate on its own, functioning solely as a platemaker, or it can be incorporated directly into a lithographic printing press. In the latter case, printing may commence immediately after imaging, thereby reducing press set-up time considerably. The imaging apparatus can be configured as a flatbed recorder or as a drum recorder, with the imaging member mounted to the interior or exterior cylindrical surface of the drum.

In the drum configuration, the requisite relative motion between an imaging device (such as laser beam) and the imaging member can be achieved by rotating the drum (and the imaging member mounted thereon) about its axis, and moving the imaging device parallel to the rotation axis, thereby scanning the imaging member circumferentially so the image "grows" in the axial direction. Alternatively, the beam can be moved parallel to the drum axis and, after each pass across the imaging member, incremented angularly so that the image "grows" circumferentially. In both cases, after a complete scan by the laser beam, an image corresponding to the original document or picture can be applied to the surface of the imaging member.

In the flatbed configuration, a laser beam is drawn across either axis of the imaging member, and is indexed along the other axis after each pass. Obviously, the requisite relative motion can be produced by moving the imaging member rather than the laser beam.

While laser imaging is preferred in the practice of this invention, imaging can be provided by any other means that provides or generates thermal energy in an imagewise fashion. For example, imaging can be accomplished using a thermoresistive head (thermal printing head) in what is known as "thermal printing", described for example in U.S. Pat. No. 5,488,025 (Martin et al.). Such thermal printing heads are commercially available (for example, as Fujitsu Thermal Head FTP-040 MCS001 and TDK Thermal Head F415 HH7-1089).

Imaging of heat-sensitive compositions on printing press cylinders can be accomplished using any suitable means, for example, as taught in U.S. Pat. No. 5,713,287 (noted above), that is incorporated herein by reference.

After imaging, the imaging member can be used for printing without conventional wet processing. Applied ink can be imagewise transferred to a suitable receiving material (such as cloth, paper, metal, glass or plastic) to provide one or more desired impressions. If desired, an intermediate blanket roller can be used to transfer the ink from the imaging member to the receiving material. The imaging members can be cleaned between impressions, if desired, using conventional cleaning means.

The following examples illustrate the practice of the invention, and are not meant to limit it in any way. The synthetic methods are presented to show how some of the preferred heat-sensitive polymers and aromatic IR dyes can be prepared.

Synthesis of IR Dyes

Bis(aminoaryl)polymethine IR dyes were prepared using the following synthetic scheme that is generally useful for making all of the bis(aminoaryl)polymethine dyes described herein.

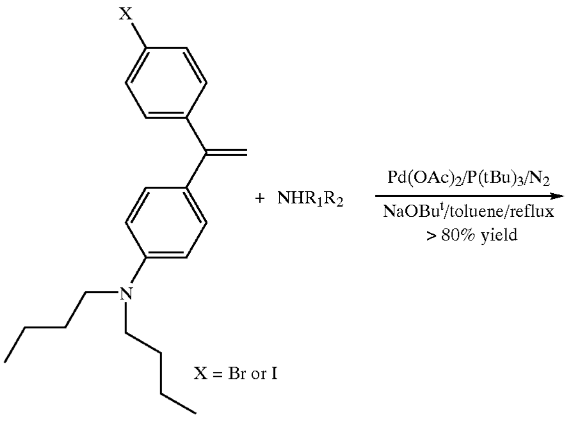

A

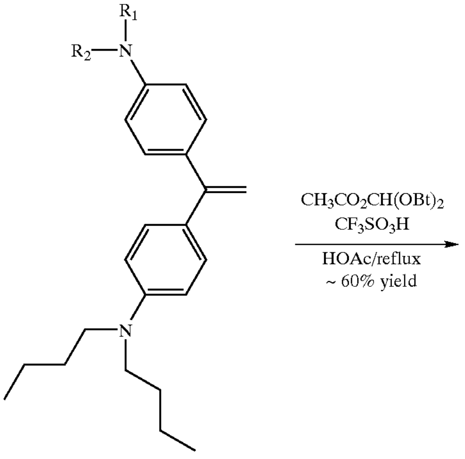

B

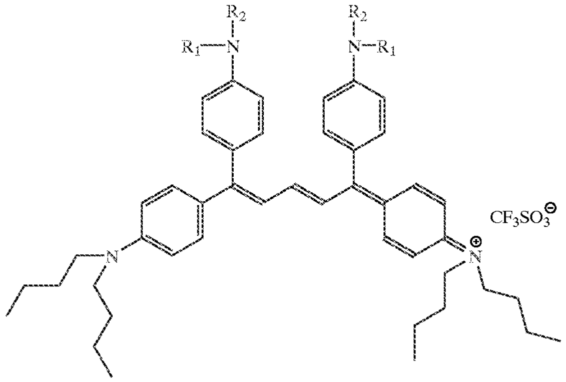

To a solution of an appropriate halide A (1 eq) and amine (1.2 eq) in an $N_2$-degassed toluene (2 ml, 1 mmol) was added $Pd(OAc)_2$ (1% mmol), P(t-butyl), (2% mmol), and NaO-t-butyl (1.4 eq) at room temperature. The resulting mixture was heated to reflux, and the reaction was monitored by thin layer chromatography. The reaction mixture was diluted with ethyl acetate and washed with water. The organic layer was separated and the aqueous layer was extracted with more ethyl acetate, the combined organic layer was dried over sodium sulfate, and the residue after the solvent removal was purified chromatographically using silica-gel as the solid support. Appropriate mixtures of ethyl acetate/heptane were used as eluent so as to obtain the pure desired product B.

To a round-bottomed flask containing the alkene B (2 eq) in HOAc (5 ml/mmol) was added diethoxymethyl acetate (1 eq) and then $CF_3SO_3H$ (1 eq) under nitrogen at room temperature. The resulting mixture was heated to reflux and the reaction was followed by the formation of typical visible absorption around 830 nm. The mixture was then cooled with an ice bath, and poured to ether (10 ml/mmol) and the dye was normally precipitated out. It can be purified either by running a silica-gel column using ethyl acetate (sometimes with 5% or more of methanol) or by recrystallization from ethanol. The purity of the dyes was confirmed by HPLC.

The following examples illustrate the practice of this invention and its advantages over embodiments outside of the scope of the invention. The invention is not to be construed as limited to these examples.

EXAMPLE 1 AND COMPARATIVE EXAMPLE 1

Imaging formulations 1 and 2 were prepared using the components (parts by weight) shown in TABLE I below:

TABLE I

| Component | Formulation 1 (Comparative Example 1) | Formulation 2 (Invention Example 1) |
|---|---|---|
| Polymer 22 | 0.33 | 0.33 |
| IR Dye A | 0.033 | — |
| Bis(aminoaryl)polymethine DYE 7 | — | 0.033 |
| Water | 3.60 | 3.60 |
| Methanol | 5.04 | 0.54 |
| Acetone | — | 4.50 |

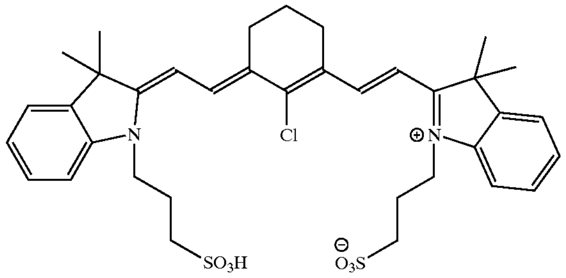

IR Dye A

Each formulation was coated at a dry coating weight of about 1.0 g/m$^2$ onto a grained phosphoric acid anodized aluminum support. The resulting printing plates were dried in a convection oven at 82° C. for 3 minutes. Each imaging layer of the printing plate was imaged at 830 nm on a plate setter like the commercially available CREO TRENDSETTER™ (but smaller in size) using doses ranging from 364 to 820 mJ/cm$^2$.

The imaging layer in the printing plate of the Comparative Example 1 rapidly discolored to a tan color in the exposed areas producing an unmistakable sulfur odor during and after many hours following imaging. By contrast, the blue imaging layer in the printing plate of Example 1 produced a deeper blue image and the undesirable sulfur smell was clearly absent. Thus, the printing plate of this invention was found to exhibit greatly reduced gaseous effluents upon imaging.

Each imaged printing plate was mounted on the plate cylinder of a commercially available full-page printing press (A. B. Dick 9870 duplicator) for a press run. A commercial black ink and Varn Universal Pink fountain solution (from Varn Products Co.) were used. Both printing plates were developed on press within 60 seconds of the press run and printed with full density and high image quality for at least 1,000 impressions.

EXAMPLES 2–7

Alternative Printing Plates Containing other bis (aminoaryl)polymethine IR Dyes Several printing plates of this invention were prepared and used in printing as described above in Example 1. The imaging layers in the printing plates contained the bis (aminoaryl)polymethine IR dyes shown in TABLE II below. Each printing plate was successfully imaged without an unbearable sulfur smell being present and was used to produce 1,000 printed sheets of good quality on the A. B. Dick press.

TABLE II

| Example | IR dye |
|---|---|
| Comparative example 1 | A |
| Invention example 2 | DYE 2 |
| Invention example 3 | DYE 3 |
| Invention example 4 | DYE 4 |
| Invention example 5 | DYE 5 |
| Invention example 6 | DYE 8 |
| Invention example 7 | DYE 10 |

The invention has been described in detail with particular reference to preferred embodiments thereof, but it will be understood that variations and modifications can be effected within the spirit and scope of the invention.

We claim:

1. A heat-sensitive composition comprising:

a) a hydrophilic heat-sensitive ionomer, b) water or a water-miscible organic solvent, and c) an infrared radiation sensitive bis(aminoaryl) polymethine dye that is soluble in water or said water-miscible organic solvent, and that has a $\lambda_{max}$ greater than 700 nm as measured in water or said water-miscible organic solvent.

2. The composition of claim 1 comprising water, methanol, ethanol, 1-methoxy-2-propanol, n-propanol, methyl ethyl ketone, acetonitrile, tetrahydrofuran, N,N-dimethylformaldehyde, butyrolactone, acetone, or a mixture of two or more of these solvents.

3. The composition of claim 1 wherein said heat-sensitive ionomer is selected from one or more of the following three classes of polymers:

I) a crosslinked or uncrosslinked vinyl polymer comprising recurring units comprising positively-charged, pendant N-alkylated aromatic heterocyclic groups, II) a crosslinked or uncrosslinked polymer comprising recurring organoonium groups, and III) a polymer comprising a pendant thiosulfate group.

4. The composition of claim 3 wherein said organoonium moiety is a pendant quaternary ammonium group on the backbone of said Class II polymer.

5. The composition of claim 1 wherein said heat-sensitive ionomer is a Class I polymer represented by the following Structure I:

I

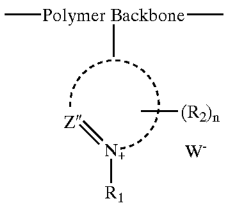

wherein $R_1$ is an alkyl group, $R_2$ is an alkyl group, an alkoxy group, an aryl group, an alkenyl group, halo, a cycloalkyl group, or a heterocyclic group having 5 to 8 atoms in the ring, Z" represents the carbon and nitrogen, oxygen, or sulfur atoms necessary to complete an aromatic N-heterocyclic ring having 5 to 10 atoms in the ring, n is 0 to 6, and $W^{31}$ is an anion.

6. The composition of claim 5 wherein $R_1$ is an alkyl group of 1 to 6 carbon atoms, $R_2$ is a methyl, ethyl or n-propyl group, Z" represents the carbon, nitrogen, oxygen, and sulfur atoms to complete a 5- or 6-membered aromatic N-heterocyclic ring, and n is 0 or 1.

7. The composition of claim 1 wherein said heat-sensitive ionomer is a Class I polymer represented by the Structure II:

II

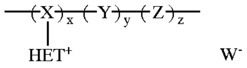

wherein $HET^+$ represents a positively-charged, pendant N-alkylated aromatic heterocyclic group, X represents recurring units having attached $HET^+$ groups, Y represents recurring units derived from ethylenically unsaturated polymerizable monomers that provide active crosslinking sites, Z represents recurring units for additional ethylenically unsaturated monomers, x is from about 20 to 100 mol %, y is from 0 to about 20 mol %, z is from 0 to about 80 mol %, and $W^-$ is an anion.

8. The composition of claim 7 wherein x is from about 30 to about 98 mol %, y is from about 2 to about 10 mol %, z is from 0 to about 68 mol %.

9. The composition of claim 7 wherein said positively-charged, pendant N-alkylated aromatic heterocyclic group is an imidazolium or pyridinium group.

10. The composition of claim 1 wherein said heat-sensitive ionomer is a Class II polymer that is a polyester, polyamide, polyamide-ester, polyarylene oxide or a derivative thereof, polyurethane, polyxylylene or a derivative thereof, a poly(phenylene sulfide) ionomer, a silicon-based sol gel, polyamidoamine, polyimide, polysulfone, polysiloxane, polyether, poly(ether ketone), polysulfide, or polybenzimidazole.

11. The composition of claim 10 wherein said heat-sensitive ionomer is a silicon-based sol gel, polyarylene oxide, poly(phenylene sulfide), or polyxylylene ionomer.

12. The composition of claim 1 wherein said heat-sensitive ionomer is a Class II vinyl polymer represented by either of the following Structures III, IV or V:

III

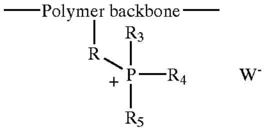

IV

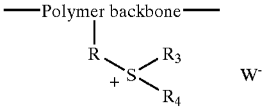

V

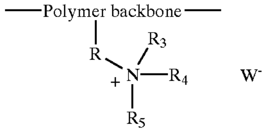

wherein R is an alkylene, arylene, or cycloalkylene group or a combination of two or more such groups, $R_3$, $R_4$, and $R_5$ are independently substituted or unsubstituted alkyl, aryl, or cycloalkyl groups, or any two of $R_3$, $R_4$, and $R_5$ can be combined to form a heterocyclic ring with the charged phosphorus, nitrogen, or sulfur atom, and $W^-$ is an anion.

13. The composition of claim 12 wherein R is an ethyleneoxycarbonyl or phenylenemethylene group, and $R_3$, $R_4$ and $R_5$ are independently a methyl or ethyl group, and $W^-$ is a halide or carboxylate.

14. The composition of claim 12 wherein said vinyl heat-sensitive ionomer is a copolymer having recurring units derived from one or more additional ethylenically unsaturated polymerizable monomers, at least one of which monomers provides crosslinking sites.

15. The composition of claim 12 wherein said heat-sensitive ionomer is represented by the following Structure VI:

VI

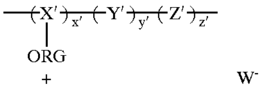

wherein ORG represents organoonium groups, X' represents recurring units to which the ORG groups are attached, Y' represents recurring units derived from ethylenically unsaturated polymerizable monomers that may provide active sites for crosslinking, Z' represents recurring units derived from any additional ethylenically unsaturated polymerizable monomers, x' is from about 20 to about 99 mol %, y' is from about 1 to about 20 mol %, and z' is from 0 to about 79 mol %.

16. The composition of claim 15 wherein x' is from about 30 to about 98 mol %, y' is from about 2 to about 10 mol %, and z' is from 0 to about 68 mol %.

17. The composition of claim 1 wherein said heat-sensitive ionomer is a Class III polymer having the following Structure VII:

VII

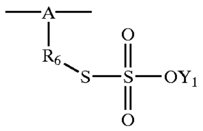

wherein A represents a polymeric backbone, $R_6$ is a divalent linking group, and $Y_1$ is a hydrogen or a cation.

18. The composition of claim 17 wherein $R_6$ is an alkylene group, an arylene group, an arylenealkylene group, or $-(COO)_p(Z_1)_m$ wherein m is 0 or 1, p is 0 or 1, and $Z_1$ is an alkylene group, an arylene group, or an arylenealkylene group, and $Y_1$ is hydrogen, ammonium ion, or a metal ion.

19. The composition of claim 18 wherein $R_6$ is an alkylene group of 1 to 3 carbon atoms, an arylene of 6 carbon atoms in the aromatic ring, an arylenealkylene of 7 or 8 carbon atoms in the chain, or $-COOZ_1$ wherein $Z_1$ is methylene, ethylene, or phenylene, and $Y_1$ is hydrogen, sodium, or potassium.

20. The composition of claim 1 wherein said heat-sensitive ionomer comprises ionic groups within at least 15 mol % of the polymer recurring units.

21. The composition of claim 1 wherein said heat-sensitive ionomer is present at from about 1 to about 10 weight %, and said bis(aminoaryl)polymethine dye is present at from about 0.2 to about 1 weight %.

22. The composition of claim 1 wherein said bis(aminoaryl)polymethine dye has a $\lambda_{max}$ of from about 750 to about 900 nm.

23. The composition of claim 1 wherein said bis(aminoaryl)polymethine dye comprises a polymethine chain having at least two carbon-carbon double bonds and that is conjugated with two aminoaryl groups, one of said aminoaryl groups being positively charged.

24. The composition of claim 1 wherein said bis(aminoaryl)polymethine dye is represented by the following DYE I structure:

DYE I

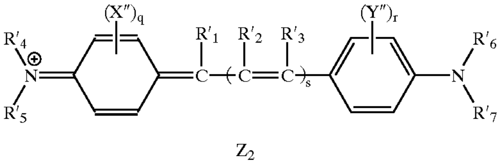

wherein $R_1'$, $R_2'$, and $R_3'$ each independently represents hydrogen, or a halo, cyano, alkoxy, aryloxy, acyloxy, carbamoyl, acyl, acylamido, alkylamino, arylamino, alkyl, aryl, or heteroaryl group, or any two of $R_1'$, $R_2'$, and $R_3'$ groups may be joined together or with an adjacent aromatic ring to complete a 5- to 7-membered carbocylic or heterocyclic ring, $R_4'$, $R_5'$, $R_6'$, and $R_7'$ each independently represents hydrogen, an alkyl group having 1 to 8 carbon atoms, a cycloalkyl group having 4 to 6 carbon atoms in the ring, an aryl group having 6 to 10 carbon atoms in the ring, or a heteroaryl group having 5 to 10 carbon and heteroatoms in the ring, or $R_4'$ and $R_5'$ or $R_6'$ and $R_7'$ can be joined together to form a 5- to 9-membered heterocyclic ring, or $R_4'$, $R_5'$, $R_6'$, or $R_7'$ can be joined to a carbon atom of an adjacent aromatic ring at a position ortho to the position of attachment of the anilino nitrogen to form, along with the nitrogen to which they are attached, a 5- or 6-membered heterocyclic ring, s is an integer of from 1 to 4, $Z_2$ is a monovalent anion, X" and Y" are independently $R_1$' or the atoms necessary to complete a 5- to 7-membered fused carbocyclic or heterocyclic ring, and q and r are independently integers of from 1 to 4.

25. The composition of claim 24 wherein $R_1$', $R_2$', and $R_3$' are independently hydrogen, a carbocyclic aryl group, or a heteroaryl group, s is 1 to 3, $R_4$', $R_5$', $R_6$', $R_7$' are independently an alkyl group, a cycloalkyl group, or an aryl group, or $R_4$' and $R_5$' or $R_6$' and $R_7$' can be joined together to form a 5- to 9-member heterocyclic ring, X" and Y" are independently hydrogen, or the carbon and hetero atoms needed to provide a fused aryl or heteroaryl ring, q and r are independently 1 or 2.

26. The composition of claim 1 comprising one or more of the following bis(aminoaryl)polymethines:

DYE 1

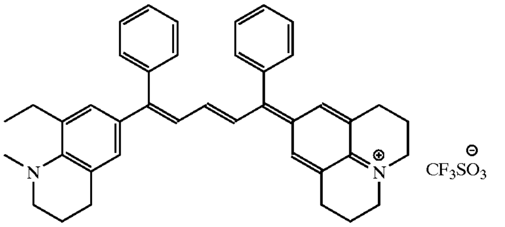

DYE 2

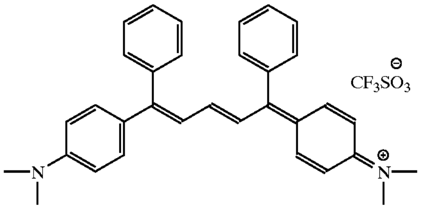

DYE 3

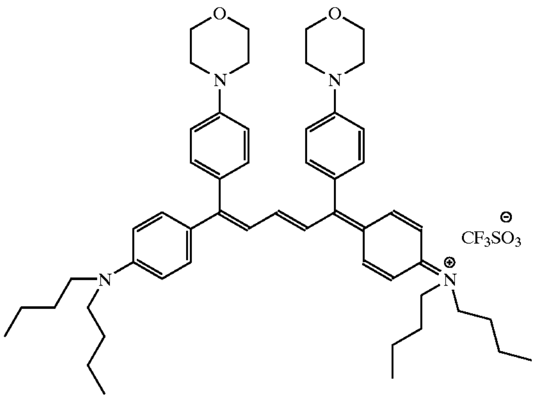

DYE 4

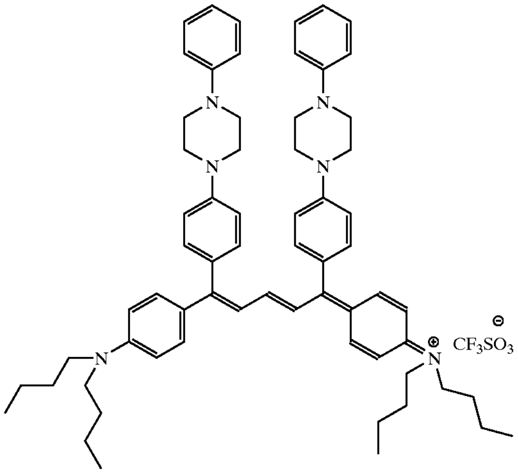

DYE 5

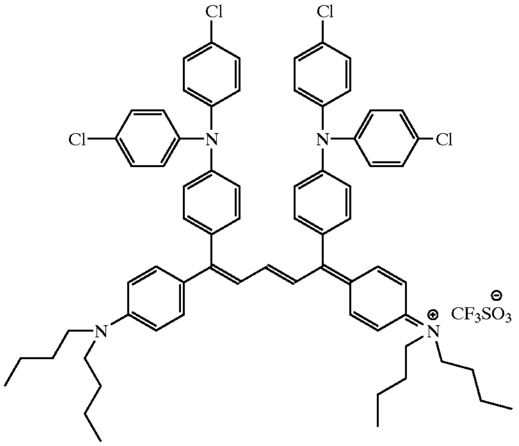

-continued
DYE 6
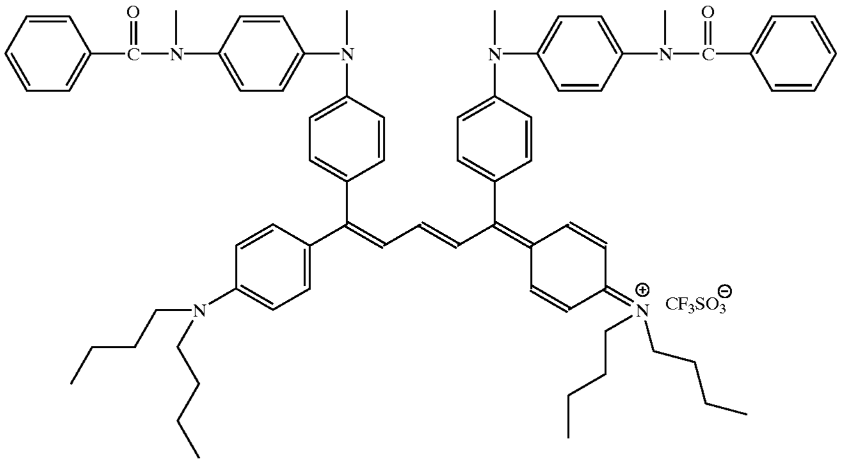
DYE 7
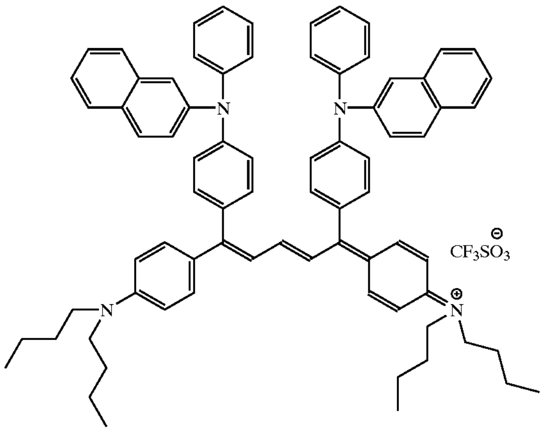
DYE 8
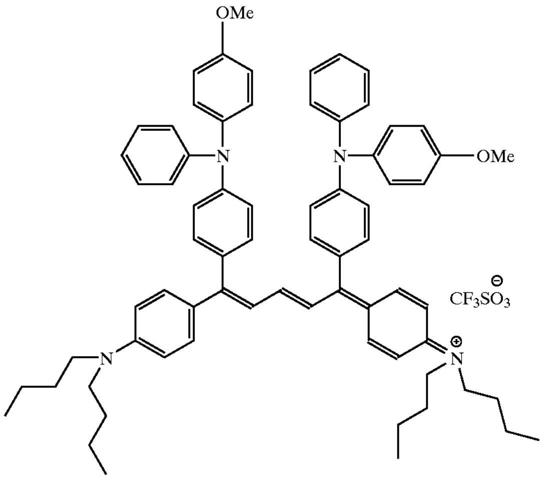
DYE 9
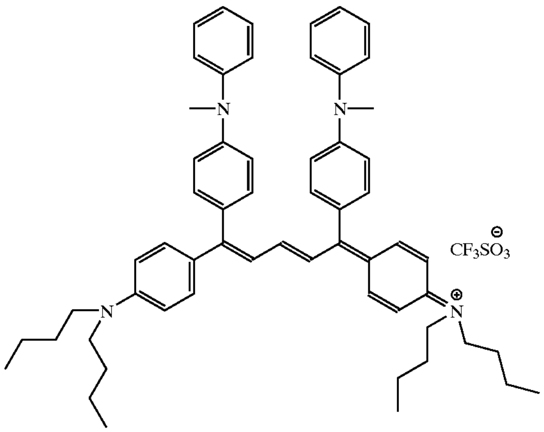
DYE 10
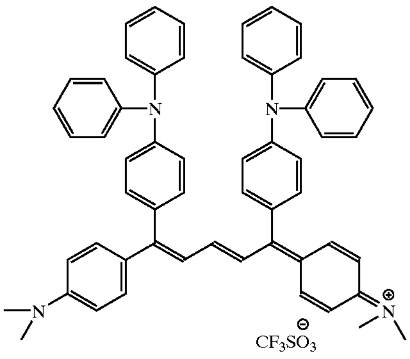

-continued
DYE 11
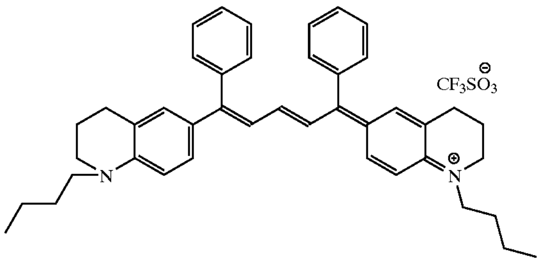
DYE 12
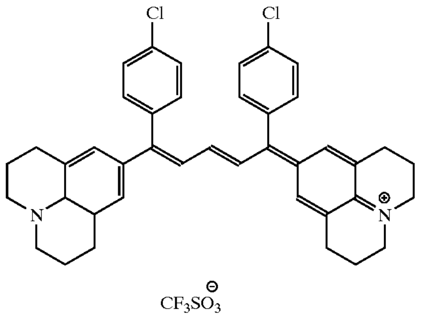
DYE 13
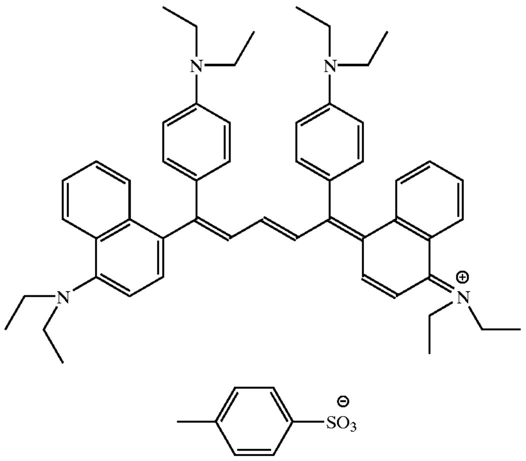
DYE 14
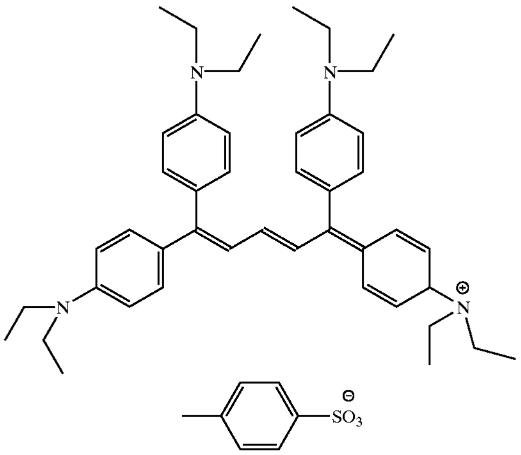
DYE 15
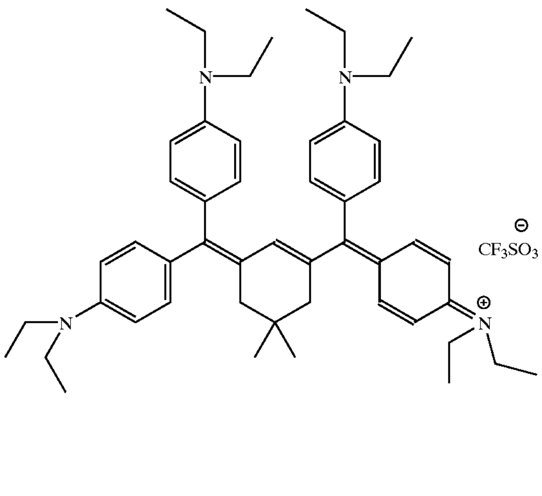
DYE 16
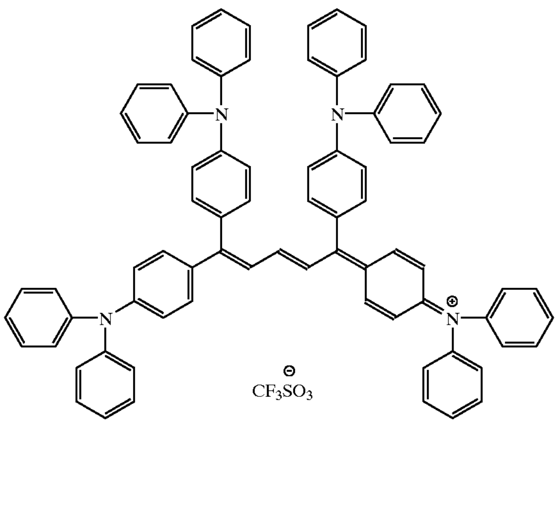

-continued

DYE 17

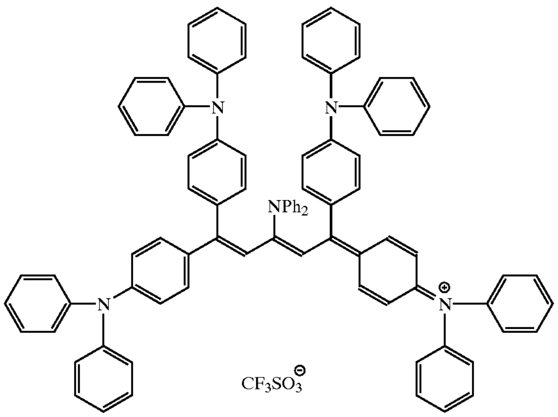

DYE 18

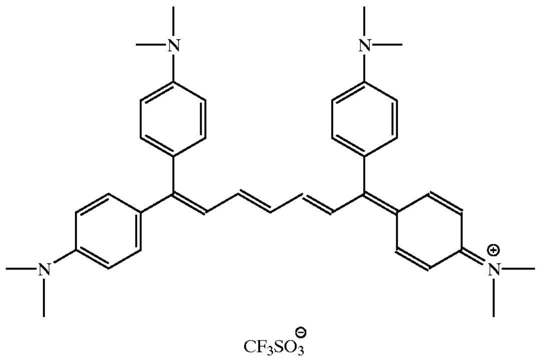

DYE 19

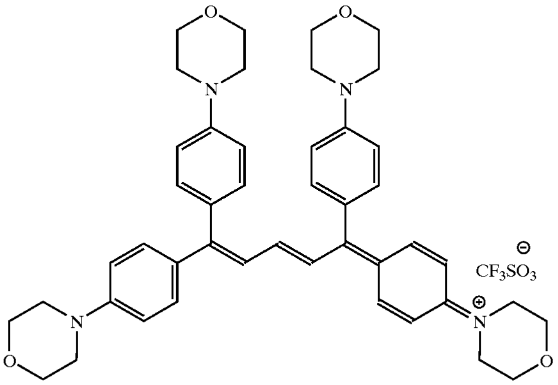

DYE 20

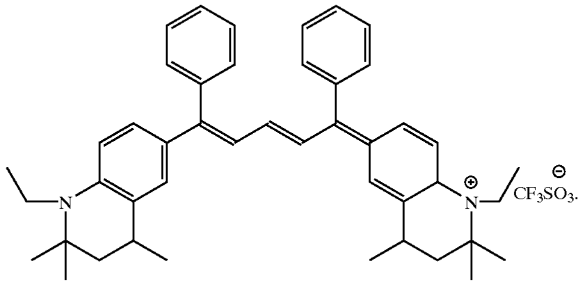

27. An imaging member comprising a support having disposed thereon a hydrophilic imaging layer that is prepared from the heat-sensitive composition of claim 1.

28. The imaging member of claim 27 wherein said heat-sensitive ionomer is present in said imaging layer in an amount of at least 0.1 $g/m^2$, and said bis(aminoaryl) polymethine dye is present in said imaging layer in an amount sufficient to provide a transmission optical density of at least 0.1 when exposed to radiation having a $\lambda_{max}$ of 830 nm.

29. The imaging member of claim 27 wherein said support is an on-press printing cylinder.

30. A method of imaging comprising:

A) providing the imaging member of claim 27, and

B) imagewise exposing said imaging member to provide exposed and unexposed areas in the imaging layer of said imaging member, whereby said exposed areas are rendered more hydrophobic than said unexposed areas by heat provided by said imagewise exposure.

31. The method of claim 30 wherein said imagewise exposing is carried out using an IR radiation emitting laser, and said imaging member is a lithographic printing plate or imaging cylinder.

32. The method of claim 30 wherein said imagewise exposing is accomplished using a thermal head.

33. A method of printing comprising:

A) providing the imaging member of claim 27,

B) imagewise exposing said imaging member to provide exposed and unexposed areas in the imaging layer of said imaging member, whereby said exposed areas are rendered more hydrophobic than said unexposed areas by heat provided by said imagewise exposure, and C) contacting said imagewise exposed imaging member with a lithographic printing ink, and imagewise transferring said printing ink from said imaging member to a receiving material.

34. The imaging member of claim 27 that is a processless imaging member.

35. A method of imaging comprising the steps of:

A) spray coating the heat-sensitive composition of claim 1 onto a support to provide an imaging member, and B) imagewise exposing said imaging member to provide exposed and unexposed areas in the imaging layer of said imaging member, whereby said exposed areas are rendered more hydrophobic than said unexposed areas by heat provided by said imagewise exposure.

36. The method of claim 35 wherein said support is an on-press printing cylinder or sleeve.

* * * * *